(12) United States Patent
Lee

(10) Patent No.: US 9,741,456 B2
(45) Date of Patent: Aug. 22, 2017

(54) ELECTRONIC DEVICE

(71) Applicant: SK hynix Inc., Icheon (KR)

(72) Inventor: Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 140 days.

(21) Appl. No.: 14/603,154

(22) Filed: Jan. 22, 2015

(65) Prior Publication Data

US 2016/0086679 A1    Mar. 24, 2016

(30) Foreign Application Priority Data

Sep. 24, 2014   (KR) .......................... 10-2014-0127648

(51) Int. Cl.
*G11C 29/00* (2006.01)
*G11C 17/16* (2006.01)
*G11C 17/18* (2006.01)

(52) U.S. Cl.
CPC .............. *G11C 29/78* (2013.01); *G11C 17/16* (2013.01); *G11C 17/18* (2013.01)

(58) Field of Classification Search
CPC ................................ G11C 29/78; G11C 17/16
USPC ......................................................... 365/72
See application file for complete search history.

(56) References Cited

U.S. PATENT DOCUMENTS

| | | | | | |
|---|---|---|---|---|---|
| 5,574,729 | A | * | 11/1996 | Kinoshita | G11C 29/848 365/200 |
| 5,933,377 | A | * | 8/1999 | Hidaka | G11C 11/406 365/200 |
| 6,072,735 | A | * | 6/2000 | Komoriya | G11C 29/846 365/200 |
| 6,310,803 | B1 | * | 10/2001 | Hidaka | G11C 29/84 365/189.04 |
| 7,355,910 | B2 | * | 4/2008 | Lee | G11C 17/165 365/200 |

FOREIGN PATENT DOCUMENTS

| | | |
|---|---|---|
| KR | 10-2010-0085898 A | 7/2010 |
| KR | 10-2012-0037371 A | 4/2012 |
| WO | WO 2010/147029 A1 | 12/2010 |

* cited by examiner

*Primary Examiner* — Hoai V Ho
*Assistant Examiner* — Muna A Techane

(57) ABSTRACT

An electronic device including a semiconductor memory unit that includes: a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed.

28 Claims, 9 Drawing Sheets

ELECTRONIC DEVICE

CROSS-REFERENCE TO RELATED APPLICATIONS

The present application claims priority of Korean Patent Application No. 10-2014-0127648, entitled "ELECTRONIC DEVICE" and filed on Sep. 24, 2014, which is incorporated herein by reference in its entirety.

BACKGROUND

1. Field

This patent document relates to memory circuits or devices and their applications in electronic devices or systems.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which has a repair function.

In an implementation, an electronic device including a semiconductor memory unit that includes: a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed.

The first repair coupling block may couple the first access line and the second access line when the first memory cell is accessed and the first memory cell is a failure memory cell. The first access line and the second access line may be disposed in a first direction and in parallel to each other. The electronic device may further include: a third access line coupled to the first memory cell and disposed in a second direction that is perpendicular to the first direction; a fourth access line coupled to the second memory cell and disposed in the second direction; a second driving block coupled to one of the third access line and the fourth access line, and suitable for driving said one of the third access line and the fourth access line with a second voltage when the first memory cell is accessed; and a second repair coupling block suitable for selectively coupling the third access line and the fourth access line based on whether the first memory cell is a failure memory cell or not when the first memory cell is accessed. The first driving block may be coupled to the first access line, and the second driving block may be coupled to the fourth access line. When the first memory cell is accessed and the first memory cell is a failure memory cell, the first repair coupling block may couple the first access line and the second access line and the second repair coupling block decouples the third access line and the fourth access line, and when the first memory cell is accessed and the first memory cell is a normal memory cell, the first repair coupling block may decouple the first access line and the second access line, and the second repair coupling block couples the third access line and the fourth access line. The first repair coupling block may include: a fuse coupled to and disposed between an access node and a first one of the first access line and the second access line, which is an access line coupled to the first driving block; and a first switch coupled to and disposed between the access node and a second one of the first access line and the second access line, which is an access line that is not coupled to the first driving block, and switching based on whether the first memory cell is a failure memory cell or not when the first memory cell is accessed. The first repair coupling block may further include: a second switch coupled to and disposed between a ground voltage end and the second one of the first access line and the second access line, and switching based on whether the fuse is programmed or not. When the fuse is programmed, the second switch may couple the ground voltage end with the second one of the first access line and the second access line, the first switch may couple the access node with the second one of the first access line and the second access line, and the first driving block may drive the first one of the first access line and the second access line with a third voltage.

In an implementation, an electronic device including a semiconductor memory unit that includes: a first access line coupled to a first memory cell of a first memory area; a second access line coupled to a second memory cell of a second memory area; a first spare line coupled to a first spare cell of a first spare area; a second spare line coupled to a second spare cell of a second spare area; a first driving block coupled to one of the first access line and the first spare line, and suitable for driving said one of the first access line and the first spare line with a first voltage when the first memory cell is accessed; a second driving block coupled to one of the second access line and the second spare line, and suitable for driving said one of the second access line and the second spare line with the first voltage when the second memory cell is accessed; and a first repair coupling block suitable for coupling the first access line and the first spare line when the first memory cell is accessed and the first memory cell is a failure memory cell, and coupling the second access line and the second spare line when the second memory cell is accessed and the second memory cell is a failure memory cell.

The first access line and the second access line may be disposed in a first direction and in parallel to the first spare line and the second spare line, respectively. The electronic device may further include: a third access line coupled to the first memory cell and disposed in a second direction that is perpendicular to the first direction; a third spare line coupled to the first spare cell and disposed in the second direction; a third driving block coupled to one of the third access line and the third spare line, and suitable for driving said one of the third access line and the third spare line with a second voltage when the first memory cell is accessed; a second repair coupling block suitable for selectively coupling the third access line and the third spare line based on whether the first memory cell is a failure memory cell or not when the first memory cell is accessed; a fourth access line coupled to the second memory cell and disposed in the second direction; a fourth spare line coupled to the second spare cell and disposed in the second direction; a fourth driving block coupled to one of the fourth access line and the fourth spare line, and suitable for driving said one of the fourth access line and the fourth spare line with the second voltage when the second memory cell is accessed; and a third repair coupling block suitable for selectively coupling the fourth access line and the fourth spare line with each other based on whether the second memory cell is a failure memory cell or not when the second memory cell is accessed. The first driving block is coupled to the first access line, and the second driving block is coupled to the second access line, the third driving block is coupled to the third spare line, and the fourth driving block is coupled to the fourth spare line. When the first memory cell is accessed and the first memory cell is a failure memory cell, the second repair coupling block decouples the third access line and the third spare line, and when the first memory cell is accessed and the first memory cell is a normal memory cell, the second repair coupling block couples the third access line and the third spare line, when the second memory cell is accessed and the second memory cell is a failure memory cell, the third repair coupling block decouples the fourth access line and the fourth spare line, and when the second memory cell is accessed and the second memory cell is a normal memory cell, the third repair coupling block couples the fourth access line and the fourth spare line. The first repair coupling block may include: a fuse coupled to and disposed between a first access node and a first one of the first access line and the first spare line, which is a line coupled to the first driving block, and coupled to and disposed between a second access node and a first one of the second access line and the second spare line, which is a line coupled to the second driving block; a first switch coupled to and disposed between the first access node and a second one of the first access line and the first spare line, which is a line that is not coupled with the first driving block, and switching based on whether the first memory cell is a failure memory cell or not when the first memory cell is accessed; and a second switch coupled to and disposed between the second access node and a second one of the second access line and the second spare line, which is a line not coupled to the second driving block, and switching based on whether the second memory cell is a failure memory cell or not when the second memory cell is accessed. The fuse may include a transistor provided with: a gate coupled to the first access line and the second access line; a first junction end coupled to the first access node; and a second junction end coupled to the second access node. The first repair coupling block may further include: a third switch coupled to and disposed between a ground voltage end and the second one of the first access line and the first spare line, and switching based on whether a first program operation is performed on the fuse or not; and a fourth switch coupled to and disposed between the ground voltage end and the second one of the second access line and the second spare line, and switching based on whether a second program operation is performed on the fuse or not. When the first program operation is performed, the third switch may couple the ground voltage end to the second one of the first access line and the first spare line, the first switch may couple the first access node to the second one of the first access line and the first spare line, and the first driving block may drive the first one of the first access line and the first spare line with a third voltage. When the second program operation is performed, the fourth switch may couple the ground voltage end to the second one of the second access line and the second spare line, the second switch may couple the second access node to the second one of the second access line and the second spare line, and the second driving block may drive the first one of the second access line and the second spare line with a third voltage.

In an implementation, an electronic device including a semiconductor memory unit that includes: a first access line coupled to a first memory cell of a first memory area; a second access line coupled to a second memory cell of the first memory area and disposed in parallel to the first access line; a third access line coupled to a third memory cell of a second memory area; a fourth access line coupled to a fourth memory cell of the second memory area and disposed in parallel to the third access line; a first spare line coupled to a first spare cell of a first spare area; a second spare line coupled to a second spare cell of a second spare area; a first driving block coupled to the first access line and the second access line, and suitable for driving the first access line and the second access line with a first voltage when the first memory cell or the second memory cell is accessed; a second driving block coupled to the third access line and the fourth access line, and suitable for driving the third access line and the fourth access line with the first voltage when the third memory cell or the fourth memory cell is accessed; and a first repair coupling block suitable for coupling one of the first spare line and the second spare line with a first failure line, wherein the first failure line is one of the first to fourth access lines coupled to a first failure memory cell that is a memory cell with a failure among the first to fourth memory cells when the first failure memory cell is accessed, and coupling the other one of the first spare line and the second spare line to a second failure line, wherein the second failure line is another one of the first to fourth access lines coupled to a second failure memory cell that is another memory cell with a failure among the first to fourth memory cells when the second failure memory cell is accessed.

The first access line and the second access line are disposed in a first direction and in parallel to the first spare line and the second spare line, respectively. The electronic device may further include: a fifth access line coupled to the first memory cell and the second memory cell and disposed in a second direction that is perpendicular to the first direction; a third spare line coupled to the first spare cell and disposed in the second direction; a third driving block coupled with the third spare line, and suitable for driving the third spare line with a second voltage when the first memory cell, the second memory cell, or the first failure memory cell is accessed; a second repair coupling block suitable for selectively coupling the fifth access line and the third spare line based on which one of the first memory cell, the second memory cell, and the first failure memory cell is accessed; a sixth access line coupled to the third memory cell and the fourth memory cell and disposed in the second direction; a fourth spare line coupled to the second spare cell and disposed in the second direction; a fourth driving block coupled to the fourth spare line, and suitable for driving the fourth spare line with the second voltage when the third memory cell, the fourth memory cell, or the second failure memory cell is accessed; and a third repair coupling block suitable for selectively coupling the sixth access line and the fourth spare line based on which one of the third memory cell, the fourth memory cell, and the second failure memory cell is accessed. When one of the first memory cell, the second memory cell, the third memory cell, and the fourth memory cell is accessed and the accessed one of the first memory cell, the second memory cell, the third memory cell, and the fourth memory cell is the first failure memory cell, the second repair coupling block may decouple the fifth access line and the third spare line, when one of the first memory cell and the second memory cell is accessed and the accessed one of the first memory cell and the second memory cell is a normal memory cell, the second repair coupling block may couple the fifth access line and the third spare line, when one of the third memory cell and the fourth memory cell is accessed and the accessed one of the third memory cell and the fourth memory cell is a normal memory cell, the second repair coupling block may decouple the fifth access line and the third spare line, when one of the first memory cell, the second memory cell, the third memory cell, and the fourth memory cell is accessed and the accessed one of the first memory cell, the second memory cell, the third memory cell, and the fourth memory cell is the second failure memory cell, the third repair coupling block may decouple the sixth access line and the fourth spare line, when one of the first memory cell and the second memory cell is accessed and the accessed one of the first memory cell and the second memory cell is a normal memory cell, the third repair coupling block may decouple the sixth access line and the fourth spare line, and when one of the third memory cell and the fourth memory cell is accessed and the accessed one of the third memory cell and the fourth memory cell is a normal memory cell, the third repair coupling block may couple the sixth access line and the fourth spare line. The first repair coupling block may include: a fuse including a first end coupled to a common access node that is coupled to the first to fourth access lines, a second end coupled to a first access node, and a third end coupled to a second access node; a first switch coupled to and disposed between the first spare line and the first access node, and turned on when the first failure memory cell is accessed; and a second switch coupled to and disposed between the second spare line and the second access node, and turned on when the second failure memory cell is accessed. The fuse may include a transistor provided with: a gate coupled to the common access node; a first junction end coupled to the first access node; and a second junction end coupled to the second access node. The first repair coupling block may further include: a third switch coupled to and disposed between the first spare line and a ground voltage end, and switching based on whether a first program operation is performed on the fuse or not; and a fourth switch coupled to and disposed between the second spare line and the ground voltage end, and switching based on whether a second program operation is performed on the fuse or not. When the first program operation is performed, the third switch may couple the first spare line to the ground voltage end, the first switch may couple the first spare line with the first access node, and the first driving block and the second driving block may drive at least one among the first to fourth access lines with a third voltage. When the second program operation is performed, the fourth switch may couple the second spare line to the ground voltage end, the second switch may couple the second spare line to the second access node, and the first driving block and the second driving block may drive at least one among the first to fourth access lines with the third voltage.

DETAILED DESCRIPTION

Various examples and implementations of the disclosed technology are described below in detail with reference to the accompanying drawings.

A semiconductor memory in accordance with implementations of the present disclosure may include a variable resistance device. Hereafter, the variable resistance device has variable resistance characteristics and may include a single layer or a multi-layer. The variable resistance device may include a material used for an RRAM (resistive random access memory), a PRAM (phase change random access memory), an FRAM (ferroelectric random access memory), an MRAM (magnetic random access memory), etc. For example, the variable resistance device may include a chalcogenide-based compound, a transition metal compound, a ferroelectric material, and a ferromagnetic material. However, the spirit and concept of the present disclosure are not limited to them, and a device having variable resistance characteristics that is capable of switching between different resistance states based on a voltage or current applied to both ends of the variable resistance device may be used.

To be specific, a variable resistance device may include a metal oxide. Examples of the metal oxide may include a transition metal oxide, such as a nickel (Ni) oxide, a titanium (Ti) oxide, a hafnium (Hf) oxide, a zirconium (Zr) oxide, a tungsten (W) oxide, a cobalt (Co) oxide and the like, and a perovskite-based material such as STO (SrTiO) and PCMO (PrCaMnO). The variable resistance device may switch between different resistance states as current filaments are formed/disappear due to the migration of vacancies.

A variable resistance device may include a phase-change material. The phase-change material may be a chalcogenide-based material such as GST (Ge—Sb—Te). The variable resistance device may switch between different resistance states as it is stabilized into either a crystalline state or an amorphous state due to heat applied thereto.

A variable resistance device may include a structure where a tunnel barrier layer is interposed between two magnetic layers. The magnetic layers may be formed of NiFeCo and/or CoFe, and the tunnel barrier layer may be formed of $Al_2O_3$. The variable resistance device may switch between different resistance states based on magnetization directions of the magnetic layers. To be specific, when the magnetization directions of the two magnetic layers are in parallel to each other, the variable resistance device may be in a low resistance state. When the magnetization directions of the two magnetic layers are in antiparallel to each other, the variable resistance device may be in a high resistance state.

Figure 1:
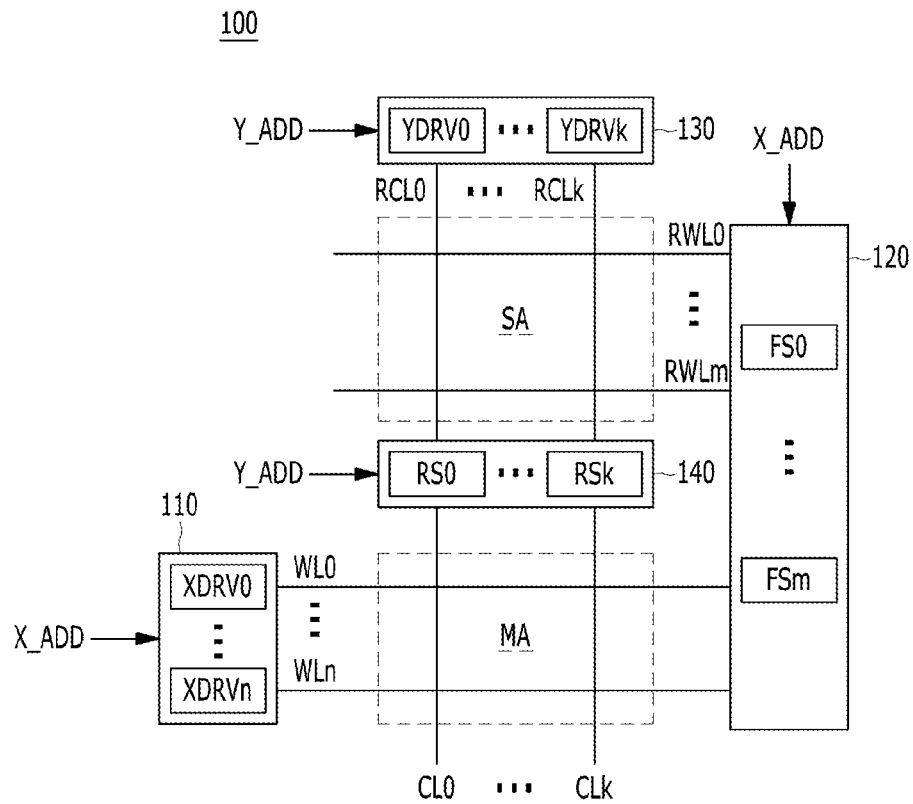
FIG. 1 is a block diagram illustrating a memory circuit in accordance with a first implementation of the present disclosure.

FIG. 1 is a block diagram illustrating a memory circuit (or device) in accordance with a first implementation of the present disclosure.

Referring to FIG. 1, a memory circuit 100 may include a memory area MA, a spare area SA, a row driving block 110, a row coupling block 120, a column driving block 130, and a column coupling block 140. The memory area MA includes a plurality of memory cells at cross points where a plurality of normal row lines WL0 to WLn intersects with a plurality of normal column lines CL0 to CLk, n and k being positive integers. The spare area SA includes a plurality of spare cells at cross points where a plurality of spare row lines RWL0 to RWLm intersects with a plurality of spare column lines RCL0 to RCLk, m being a positive integer.

The row driving block 110 selectively enables the normal row lines WL0 to WLn based on a row address X_ADD. The row coupling block 120 selectively couples the normal row lines WL0 to WLn and the spare row lines RWL0 to RWLm with each other based on the row address X_ADD and depending on whether or not there is a memory cell having defects in the memory area MA. The column driving block 130 selectively enables the spare column lines RCL0 to RCLk based on a column address Y_ADD. The column coupling block 140 selectively couples the spare column lines RCL0 to RCLk and the normal column lines CL0 to CLk with each other based on the column address Y_ADD and depending on whether or not there is a memory cell having defects in the memory area MA.

The memory area MA may include a plurality of memory cells as described above. Predetermined data may be written in a memory cell or read out of the memory cell as a corresponding normal row line and a corresponding normal column line are enabled.

The spare area SA may include a plurality of spare cells as described above. The spare cells may be redundancy memory cells that replace memory cells, having defects, among the memory cells. A memory cell having a defect will be referred to as a 'failure memory cell'. On the other hand, a memory cell that does not have a defect and operates normally will be referred to as a 'normal memory cell'.

The row driving block 110 may drive a normal row line coupled to an arbitrary memory cell with a first voltage when the arbitrary memory cell is accessed by the row address X_ADD. The normal row line coupled to the arbitrary memory cell is referred to as an 'arbitrary normal row line WL#', hereafter. For example, the row driving block 110 may drive the first normal row line WL0 with the first voltage when a first normal memory cell disposed at a cross point of the first normal row line WL0 and the first normal column line CL0 is accessed. If the arbitrary memory cell is accessed, a write operation for writing data in the arbitrary memory cell or a read operation for reading out data from the arbitrary memory cell may be performed. The row driving block 110 may include a plurality of row driving units XDRV0 to XDRVn for driving the normal row lines WL0 to WLn, respectively.

The row coupling block 120 may couple the arbitrary normal row line WL# with a spare row line among the spare row lines RWL0 to RWLm when a failure memory cell coupled to the arbitrary normal row line WL# is accessed. Thus, an arbitrary spare cell coupled to the spare row line is accessed instead of the failure memory cell. The spare row line coupled to the arbitrary spare cell is referred to as an arbitrary spare row line RWL#, hereafter.

To take an example, when the first memory cell is accessed and the first memory cell is a failure memory cell, the row coupling block 120 may couple the first normal row line WL0 and the first spare row line RWL0 to each other so that a first spare cell coupled to the first spare row line RWL0 and the first spare column line RCL0 may replace the first memory cell. On the other hand, when the first memory cell is accessed and the first memory cell is a normal memory cell and not a failure memory cell, the row coupling block 120 may not couple the first normal row line WL0 and the first spare row line RWL0 to each other.

The row coupling block 120 may include a plurality of row coupling units FS0 to FSm for selectively coupling the normal row lines WL0 to WLn with the spare row lines RWL0 to RWLm. The number of the normal row lines WL0 to WLn and the number of the spare row lines RWL0 to RWLm may be the same (n=m), or the number of the normal row lines WL0 to WLn may be greater than the number of the spare row lines RWL0 to RWLm (n>m).

The column driving block 130 may drive a spare column line coupled to an arbitrary spare cell with a second voltage, and the arbitrary spare cell may be replaced with an arbitrary memory cell when the arbitrary memory cell is accessed. The spare column line coupled to the arbitrary spare cell is referred to as an 'arbitrary spare column line RCL#', hereafter. For example, the column driving block 130 may drive a first spare column line RCL0 with the second voltage when the first memory cell coupled to the first column line CL0 is accessed.

The column coupling block 140 may selectively couple the arbitrary spare column line RCL# with a corresponding one of the normal column lines CL0 to CLk according to whether an arbitrary memory cell coupled to the corresponding normal column line is a failure memory cell or not when the arbitrary memory cell is accessed. The normal column line coupled to the arbitrary memory cell is referred to as an arbitrary normal column line CL#, hereafter.

To take an example, when the first memory cell is accessed and the first memory cell is a failure memory cell, the column coupling block 140 may not couple the first spare column line RCL0 and the first normal column line CL0 with each other. As a result, the second voltage is applied only to the first spare column line RCL0 so that the first spare cell replaces the first memory cell. Conversely, when the first memory cell is accessed and the first memory cell is not a failure memory cell, the column coupling block 140 may couple the first spare column line RCL0 and the first normal column line CL0 with each other. As a result, the second voltage is applied to the first spare column line RCL0 to the first normal column line CL0, too. Meanwhile, the column coupling block 140 may include a plurality of column coupling units RS0 to RSk for respectively coupling the normal column lines CL0 to CLk with the spare column lines RCL0 to RCLk.

Figure 2:
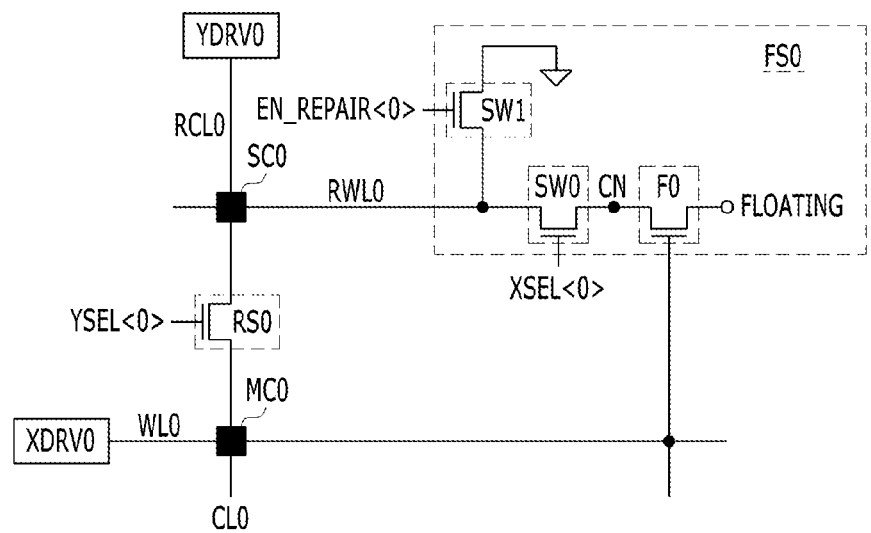
FIG. 2 is a schematic diagram illustrating a portion of the memory circuit shown in FIG. 1 in accordance with an implementation of the present disclosure.

FIG. 2 is a schematic diagram illustrating a portion of the memory circuit 100 shown in FIG. 1 in accordance with an implementation of the present disclosure.

For the sake of convenience of description, parts MC0, SC0, XDRV0, FS0, YDRV0 and RS0 of the components MA, SA, 110, 120, 130 and 140 of FIG. 1 are shown in FIG. 2.

Referring to FIG. 2, the memory circuit 100 may include the first memory cell MC0, the first spare cell SC0, the first row driving unit XDRV0, the first row coupling unit FS0, the first column driving unit YDRV0, and the first column coupling unit RS0.

The first memory cell MC0 is disposed at a cross point of the first normal row line WL0 and the first normal column line CL0. The first spare cell SC0 is disposed at a cross point of the first spare row line RWL0 and the first spare column line RCL0. The first normal row line WL0 and the first spare row line RWL0 are disposed in a first direction and in parallel to each other. The first normal column line CL0 is disposed in a second direction that is perpendicular to the first direction.

The first row driving unit XDRV0 drives the first normal row line WL0 with the first voltage when the first memory cell MC0 is accessed. The first row coupling unit FS0 selectively couples the first normal row line WL0 and the first spare row line RWL0 with each other based on whether the first memory cell MC0 is a failure memory cell or not when the first memory cell MC0 is accessed.

The first column driving unit YDRV0 drives the first spare column line RCL0 with the second voltage when the first memory cell MC0 is accessed. The first column coupling unit RS0 selectively couples the first spare column line RCL0 and the first normal column line CL0 with each other based on whether the first memory cell MC0 is a failure memory cell or not when the first memory cell MC0 is accessed.

In an implementation, the first row coupling unit FS0 may include a fuse F0, a first switch SW0, and a second switch SW1. The fuse F0 is coupled to and disposed between the first normal row line WL0 and an access node CN. The first switch SW0 is coupled to and disposed between the first spare row line RWL0 and the access node CN, and switches according to whether the first memory cell MC0 is a failure memory cell or not when the first memory cell MC0 is accessed. The second switch SW1 is coupled to and disposed between the first spare row line RWL0 and a ground voltage end VSS and switches according to whether or not a program operation is performed on the fuse F0.

The fuse F0 may include an electrical fuse (e-fuse) or an anti-fuse. In an implementation, the fuse F0 may include a MOS transistor having a gate coupled to the first normal row line WL0, one of a source and a drain coupled to the access node CN, and the other of the source and the drain remaining in a floating state. In this case, the fuse F0 may be programmed when a high voltage is applied to the first normal row line WL0 coupled to the gate and a low voltage is applied to the access node CN.

The first switch SW0 may selectively couple the access node CN and the first spare row line RWL0 with each other in response to a first row selection signal XSEL<0>. For example, when the first memory cell MC0 is accessed and the first memory cell MC0 is a failure memory cell, the first switch SW0 may couple the access node CN and the first spare row line RWL0 with each other. Conversely, when the first memory cell MC0 is accessed and the first memory cell MC0 is not a failure memory cell, the first switch SW0 may not couple the access node CN and the first spare row line RWL0 with each other. Also, during the program operation, the first switch SW0 may couple the access node CN and the first spare row line RWL0 with each other. That is, the first row selection signal XSEL<0> is enabled when the first memory cell MC0 is accessed and the first memory cell MC0 is a failure memory cell, and the first row selection signal XSEL<0> is also enabled when the fuse F0 is programmed in a test mode. Although not illustrated in the drawings, the first row selection signal XSEL<0> may be an internal signal that is generated in the memory circuit 100 based on the row address X_ADD.

The second switch SW1 may selectively couple the first spare row line RWL0 and the ground voltage end VSS with each other in response to a first program enable signal EN_REPAIR<0>. To take an example, when the fuse F0 is programmed, during the program operation, the second switch SW1 may couple the first spare row line RWL0 with the ground voltage end VSS. Conversely, when the program operation is not being performed, the second switch SW1 may not couple the first spare row line RWL0 and the ground voltage end VSS with each other. Although not illustrated in the drawings, the first program enable signal EN_REPAIR<0> may be an external signal inputted from outside the memory circuit 100 or an internal signal generated within the memory circuit 100 during a predetermined mode. The first program enable signal EN_REPAIR<0> may be enabled when the fuse F0 is programmed in the test mode.

Meanwhile, the first column coupling unit RS0 may include a MOS transistor for selectively coupling the first spare column line RCL0 with the first normal column line CL0 based on a first column selection signal YSEL<0>. For example, when the first memory cell MC0 is accessed and the first memory cell MC0 is a failure memory cell, the first column coupling unit RS0 may electrically disconnect the first spare column line RCL0 from the first normal column line CL0. Conversely, when the first memory cell MC0 is accessed and the first memory cell MC0 is not a failure memory cell, the first column coupling unit RS0 may electrically connect the first spare column line RCL0 and the first normal column line CL0 with each other. Although not illustrated in the drawings, the first column selection signal YSEL<0> may be an internal signal that is generated in the memory circuit 100 based on a column address Y_ADD. The first column selection signal YSEL<0> may be enabled when the first memory cell MC0 is accessed and the first memory cell MC0 is not a failure memory cell.

Hereafter, an operation of the memory circuit 100 having the above-described structure will be described. For the sake of convenience of description, operations of the memory circuit 100 are described with reference to FIG. 2.

The first memory cell MC0 of the memory circuit 100 may be tested during a first stage of the test mode to determine if the first memory cell MC0 is a failure memory cell. For example, in the first stage of the test mode, predetermined data is written in the first memory cell MC0 and then read out of the first memory cell MC0.

Subsequently, if it is determined that the first memory cell MC0 is a failure memory cell, the memory circuit 100 may perform a program operation during a second stage of the test mode. For example, when the second stage of the test mode begins, the first row driving unit XDRV0 may drive the first normal row line WL0 with a third voltage for performing the program operation, the first switch SW0 may couple the access node CN and the first spare row line RWL0 with each other in response to the first row selection signal XSEL<0>, and the second switch SW1 may couple the first spare row line RWL0 and the ground voltage end VSS with each other in response to the first program enable signal EN_REPAIR<0>. The fuse F0 then falls in a low resistance state, thus electrically coupling the first normal row line WL0 with the access node CN.

Subsequently, when a normal mode begins and the first memory cell MC0 is accessed, the memory circuit 100 may select the first memory cell MC0 or the first spare cell SC0 based on whether or not the first memory cell MC0 is a failure memory cell.

If the first memory cell MC0 is a failure memory cell, the first spare cell SC0 may be selected instead of the first memory cell MC0 based on the row address X_ADD and the column address Y_ADD. To be specific, when the first row driving unit XDRV0 drives the first normal row line WL0 with the first voltage, the first switch SW0 may electrically couple the access node CN and the first spare row line RWL0 with each other in response to the first row selection signal XSEL<0>. In an implementation, the first row selection signal XSEL<0> may be designed to be enabled when the first row driving unit XDRV0 is enabled and the first memory cell MC0 is a failure memory cell. As a result, the first voltage may be transmitted to the first spare row line RWL0 through the first normal row line WL0 and the first row coupling unit FS0. When the first column driving unit YDRV0 drives the first spare column line RCL0 with the second voltage, the first column coupling unit RS0 may electrically disconnect the first spare column line RCL0 from the first normal column line CL0 in response to the first column selection signal YSEL<0>. In an implementation, the first column selection signal YSEL<0> may be designed to be disabled when the first column driving unit YDRV0 is enabled and the first memory cell MC0 is a failure memory cell. As a result, the second voltage may be applied only to the first spare column line RCL0, and the first column coupling unit RS0 may prevent the second voltage from being transmitted to the first normal column line CL0. Therefore, when the first memory cell MC0 is accessed and the first memory cell MC0 is a failure memory cell, the first spare cell SC0 disposed at the cross point of the first spare row line RWL0 to which the first voltage is applied and the first spare column line RCL0 to which the second voltage is applied may be selected instead of the first memory cell MC0.

When the first memory cell MC0 is not a failure memory cell, the first memory cell MC0 is selected based on the row address X_ADD and the column address Y_ADD. To be specific, when the first row driving unit XDRV0 drives the first normal row line WL0 with the first voltage, the first switch SW0 may electrically disconnect the access node CN from the first spare row line RWL0 in response to the first row selection signal XSEL<0>. In an implementation, the first row selection signal XSEL<0> may be designed to be disabled when the first row driving unit XDRV0 is enabled and the first memory cell MC0 is a normal memory cell. As a result, the first voltage may be applied only to the first normal row line WL0, and the first row coupling unit FS0 may prevent the first voltage from being transmitted to the first spare row line RWL0. Also, when the first column driving unit YDRV0 drives the first spare column line RCL0 with the second voltage, the first column coupling unit RS0 may electrically connect the first spare column line RCL0 and the first normal column line CL0 with each other in response to the first column selection signal YSEL<0>. In an implementation, the first column selection signal YSEL<0> may be designed to be enabled when the first column driving unit YDRV0 is enabled and the first memory cell MC0 is a normal memory cell. Therefore, when the first memory cell MC0 is accessed and the first memory cell MC0 is a normal memory cell, the first memory cell MC0 disposed at the cross point of the first normal row line WL0 to which the first voltage is applied and the first normal column line CL0 to which the second voltage is applied may be selected.

Figure 3:
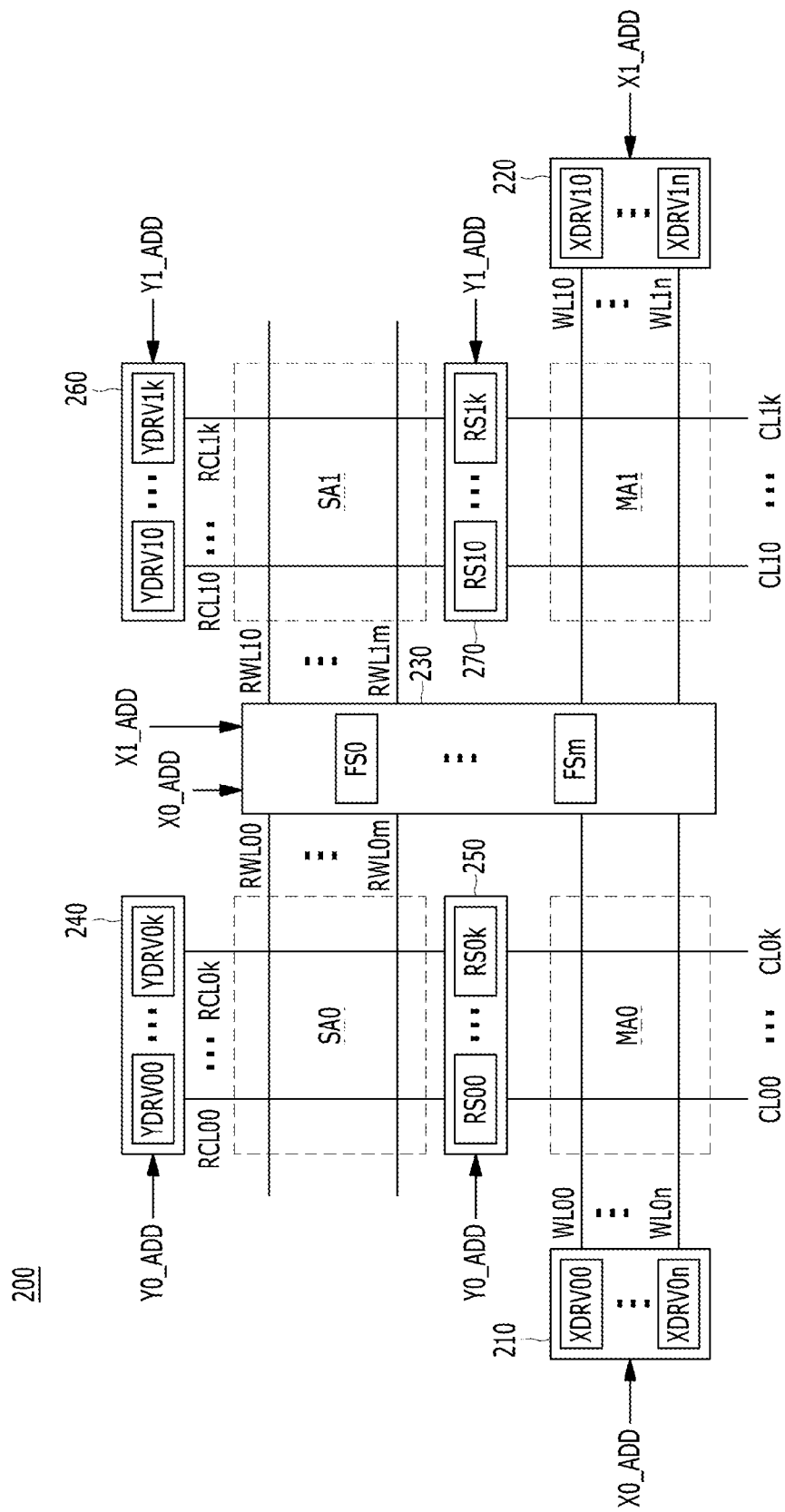
FIG. 3 is a block diagram illustrating a memory circuit in accordance with a second implementation of the present disclosure.

FIG. 3 is a block diagram illustrating a memory circuit in accordance with a second implementation of the present disclosure.

Referring to FIG. 3, a memory circuit 200 may include a first memory area MA0, a first spare area SA0, a first row driving block 210, a second memory area MA1, a second spare area SA1, a second row driving block 220, a row coupling block 230, a first column driving block 240, a first column coupling block 250, a second column driving block 260, and a second column coupling block 270.

The first memory area MA0 includes memory cells of a first group at cross points where normal row lines WL00 to WL0n of the first group intersect with normal column lines CL00 to CL0k of the first group. The first spare area SA0 includes spare cells of the first group at cross points where spare row lines RWL00 to RWL0m of the first group intersect with spare column lines RCL00 to RCL0k of the first group. The first row driving block 210 selectively enables the normal row lines WL00 to WL0n of the first group based on a first row address X0_ADD. In this implementation, the first group includes the first spare area SA0, the first memory area MA0, and elements related to operations of the first spare area SA0 and the first memory area MA0.

The second memory area MA1 includes memory cells of a second group at cross points where normal row lines WL10 to WL1n of the second group intersect with normal column lines CL10 to CL1k of the second group. The second spare area SA1 includes spare cells of the second group at cross points where spare row lines RWL10 to RWL1m of the second group intersect with spare column lines RCL10 to RCL1k of the second group. The second row driving block 220 selectively enables the normal row lines WL10 to WL1n of the second group based on a second row address X1_ADD. In this implementation, the second group includes the second spare area SA1, the second memory area MA1, and elements related to operations of the second spare area SA1 and the second memory area MA1.

The row coupling block 230 selectively couples the normal row lines WL00 to WL0n of the first group with the spare row lines RWL00 to RWL0m of the first group based on the first row address X0_ADD and depending on whether or not there is a failure memory cell in the first memory area MA0. The row coupling block 230 selectively couples the normal row lines WL10 to WL1n of the second group with the spare row lines RWL10 to RWL1m of the second group based on the second row address X1_ADD and depending on whether or not there is a failure memory cell in the second memory area MA1.

The first column driving block 240 selectively enables the spare column lines RCL00 to RCL0k of the first group based on a first column address Y0_ADD. The first column coupling block 250 selectively couples the spare column lines RCL00 to RCL0k of the first group with the normal column lines CL00 to CL0k of the first group based on the first column address Y0_ADD and depending on whether or not there is a failure memory cell in the first memory area MA0.

The second column driving block 260 selectively enables the spare column lines RCL10 to RCL1k of the second group based on a second column address Y1_ADD. The second column coupling block 270 selectively couples the spare column lines RCL10 to RCL1k of the second group with the normal column lines CL10 to CL1$k$ of the second group based on the second column address Y1_ADD and depending on whether or not there is a failure memory cell in the second memory area MA1.

The first memory area MA0 may include the memory cells of the first group as described above. Predetermined data may be written in a memory cell of the first group or read out of the memory cell of the first group when a corresponding normal row line and a corresponding normal column line are enabled. The first memory area MA0 may have a cross-point cell array structure.

The first spare area SA0 may include the spare cells of the first group as described above. The spare cells of the first group may be redundancy memory cells to be replaced with failure memory cells among the memory cells of the first group. The first spare area SA0 may also have a cross-point cell array structure, like the first memory area MA0.

The first row driving block 210 may selectively drive the normal row lines WL00 to WL0$n$ of the first group with a first voltage when a memory cell of the first group is accessed. For example, when a first memory cell of the first group, which is disposed at a cross point of the first normal row line WL00 of the first group and the first normal column line CL00 of the first group, is accessed, the first row driving block 210 may drive the first normal row line WL00 with the first voltage. When the first memory cell of the first group is accessed, a write operation for writing data in the first memory cell or a read operation for reading out data from the first memory cell is performed. The first row driving block 210 may include row driving units XDRV00 to XDRV0$n$, and one of the row driving units XDRV00 to XDRV0$n$ may be activated to drive one normal row line corresponding to the first row address X0_ADD among the normal row lines WL00 to WL0$n$ of the first group.

The second memory area MA1 may include the memory cells of the second group as described above. Predetermined data may be written in a memory cell of the second group or read out of the memory cell of the second group when a corresponding normal row line and a corresponding normal column line are enabled. The second memory area MA1 may have a cross-point cell array structure.

The second spare area SA1 may include the spare cells of the second group as described above. The spare cells of the second group may be redundancy memory cells that replace failure memory cells among the memory cells of the second group. The second spare area SA1 may also have a cross-point cell array structure, like the second memory area MA1.

The second row driving block 220 may selectively drive the normal row lines WL10 to WL1$n$ of the second group with the first voltage when a memory cell of the second group is accessed. For example, when a first memory cell of the second group, which is disposed at a cross point of the first normal row line WL10 of the second group and the first normal column line CL10 of the second group, is accessed, the second row driving block 220 may drive the first normal row line WL10 with the first voltage. When the first memory cell of the second group is accessed, a write operation for writing data in the first memory cell or a read operation for reading out data from the first memory cell is performed. The second row driving block 220 may include row driving units XDRV10 to XDRV1$n$. One of the row driving units XDRV10 to XDRV1$n$ may be activated to drive one normal row line corresponding to the second row address X1_ADD among the normal row lines WL10 to WL1$n$ of the second group.

For the first group, the row coupling block 230 may selectively couple the normal row lines WL00 to WL0$n$ with the spare row lines RWL00 to RWL0$m$ according to whether a memory cell of the first group is a failure memory cell or not when the memory cell of the first group is accessed. To give an example, when the first memory cell of the first group is accessed and the first memory cell is a failure memory cell, the row coupling block 230 may couple the first normal row line WL00 and the first spare row line RWL00 with each other so that a first spare cell coupled to the first spare row line RWL00 and the first spare column line RCL00 may replace the failed first memory cell of the first group. When the first memory cell is accessed and the first memory cell is not a failure memory cell, the row coupling block 230 may not couple the first normal row line WL00 and the first spare row line RWL00 with each other.

For the second group, the row coupling block 230 may selectively couple the normal row lines WL10 to WL1$n$ with the spare row lines RWL10 to RWL1$m$ according to whether a memory cell of the second group is a failure memory cell or not when the memory cell of the second group is accessed. To give an example, when the first memory cell of the second group is accessed and the first memory cell is a failure memory cell, the row coupling block 230 may couple the first normal row line WL10 and the first spare row line RWL10 with each other so that a first spare cell coupled to the first spare row line RWL10 and the first spare column line RCL10 may replace the failed first memory cell of the second group. When the first memory cell is accessed and the first memory cell is not a failure memory cell, the row coupling block 230 may not couple the first normal row line WL10 and the first spare row line RWL10 with each other.

The row coupling block 230 may include a plurality of common row coupling units FS0 to FS$m$ for respectively coupling the normal row lines WL00 to WL0$n$ of the first group with the spare row lines RWL00 to RWL0$m$ of the first group and coupling the normal row lines WL10 to WL1$n$ of the second group with the spare row lines RWL10 to RWL1$m$ of the second group. The number of the normal row lines WL00 to WL0$n$ of the first group and the normal row lines WL10 to WL1$n$ of the second group and the number of the spare row lines RWL00 to RWL0$m$ of the first group and the spare row lines RWL10 to RWL1$m$ of the second group may be the same (n=m), or the number of the normal row lines WL00 to WL0$n$ of the first group and the normal row lines WL10 to WL1$n$ of the second group may be greater than the number of the spare row lines RWL00 to RWL0$m$ of the first group and the spare row lines RWL10 to RWL1$m$ of the second group (n>m).

The first column driving block 240 may drive the spare column lines RCL00 to RCL0$k$ of the first group with a second voltage when a memory cell of the first group is accessed. For example, the first column driving block 240 may drive a first spare column line RCL00 with the second voltage when the first memory cell of the first group is accessed.

The first column coupling block 250 may selectively couple the spare column lines RCL00 to RCL0$k$ of the first group with the normal column lines CL00 to CL0$k$ of the first group according to whether a memory cell of the first group is a failure memory cell or not when the memory cell of the first group is accessed. To give an example, when the first memory cell of the first group is accessed and the first memory cell is a failure memory cell, the first column coupling block 250 may not couple the first spare column line RCL00 and the first normal column line CL00 with each other. As a result, the second voltage is applied only to the first spare column line RCL00 so that the first spare cell of the first group replaces the first memory cell. Conversely, when the first memory cell is accessed and the first memory cell is not a failure memory cell, the first column coupling block 250 may couple the first spare column line RCL00 and the first normal column line CL00 with each other. As a result, the second voltage applied to the first spare column line RCL00 is applied to the first normal column line CL00, too. Meanwhile, the first column coupling block 250 may include column coupling units RS00 to RS0$k$ for respectively coupling the spare column lines RCL00 to RCL0$k$ with the normal column lines CL00 to CL0$k$.

The second column driving block 260 may drive the spare column lines RCL10 to RCL1$k$ of the second group with the second voltage when a memory cell of the second group is accessed. For example, the second column driving block 260 may drive the first spare column line RCL10 of the second group with the second voltage when the first memory cell of the second group is accessed.

The second column coupling block 270 may selectively couple the spare column lines RCL10 to RCL1$k$ of the second group with the normal column lines CL10 to CL1$k$ of the second group according to whether a memory cell of the second group is a failure memory cell or not when the memory cell of the second group is accessed. To give an example, when the first memory cell of the second group is accessed and the first memory cell is a failure memory cell, the second column coupling block 270 may not couple the first spare column line RCL10 and the first normal column line CL10 with each other. As a result, the second voltage is applied only to the first spare column line RCL10 so that the first spare cell replaces the first memory cell. Conversely, when the first memory cell is accessed and the first memory cell is not a failure memory cell, the second column coupling block 270 may couple the first spare column line RCL10 and the first normal column line CL10 with each other. As a result, the second voltage applied to the first spare column line RCL10 is applied to the first normal column line CL10, too. Meanwhile, the second column coupling block 270 may include column coupling units RS10 to RS1$k$ for respectively coupling the spare column lines RCL10 to RCL1$k$ with the normal column lines CL10 to CL1$k$.

Figure 4:
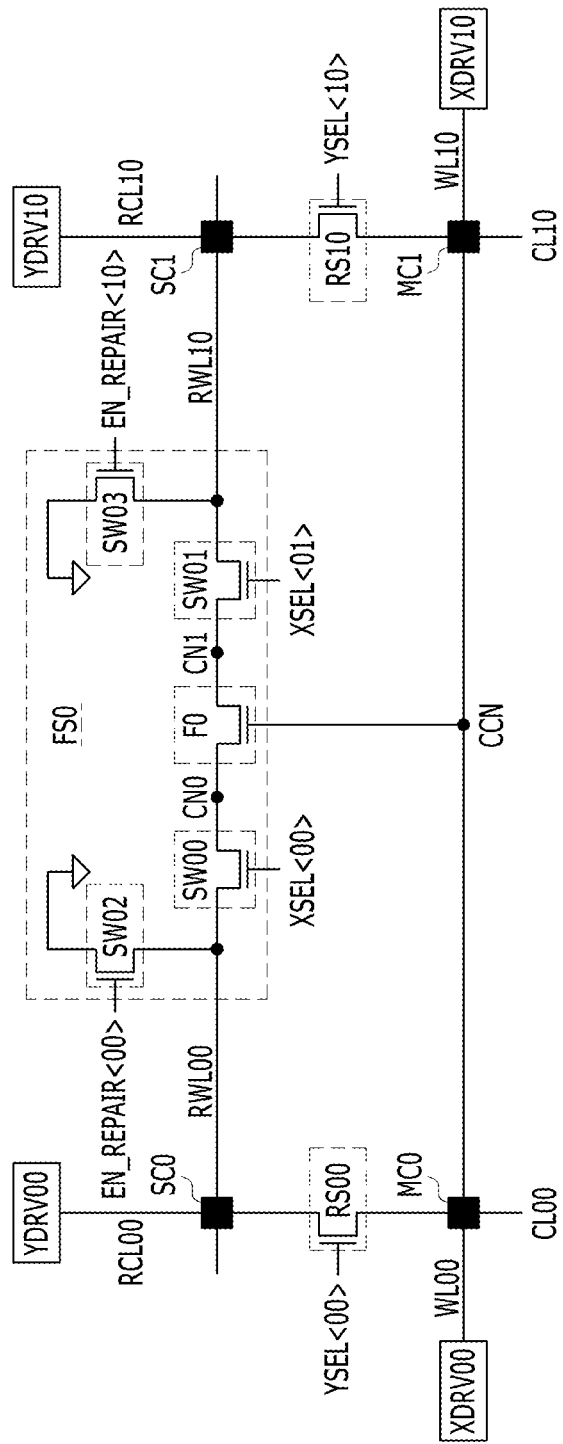
FIG. 4 is a schematic diagram illustrating a portion of the memory circuit shown in FIG. 3 in accordance with an implementation of the present disclosure.

FIG. 4 is a schematic diagram illustrating a portion of the memory circuit 200 shown in FIG. 3 in accordance with an implementation of the present disclosure.

For the sake of convenience of description, parts MC0, SC0, XDRV00, MC1, SC1, XDRV10, FS0, YDRV00, RS00, YDRV10, and RS10 of the components MA0, SA0, 210, MA1, SA1, 220, 230, 240, 250, 260 and 270 of FIG. 3 are shown in FIG. 4. In FIG. 4, a case where the normal row lines WL00 to WL0$n$ of the first group and the spare row lines RWL00 to RWL0$m$ of the first group are formed one-to-one, and the normal row lines WL10 to WL1$n$ of the second group and the spare row lines RWL10 to RWL1$m$ of the second group are formed one-to-one is shown as an example (n=m). However, implementations are not limited thereto.

Referring to FIG. 4, the memory circuit 200 may include the first memory cell MC0, the first spare cell SC0, the first row driving unit XDRV00, the second memory cell MC1, the second spare cell SC1, the second row driving unit XDRV10, the first common row coupling unit FS0, the first column driving unit YDRV00, the first column coupling unit RS00, the second column driving unit YDRV10, and the second column coupling unit RS10.

The first memory cell MC0 is disposed at a cross point of the first normal row line WL00 of the first group and the first normal column line CL00 of the first group. The first spare cell SC0 is disposed at a cross point of the first spare row line RWL00 of the first group and the first spare column line RCL00 of the first group. The first row driving unit XDRV00 drives the first normal row line WL00 with the first voltage when the first memory cell MC0 is accessed.

The second memory cell MC1, i.e., the first memory cell MC1 of the second group, is disposed at a cross point of a second normal row line, which is the first normal row line WL10 of the second group, and a second normal column line, which is the first normal column line CL10 of the second group. The second spare cell SC1 is disposed at a cross point of a second spare row line, which is the first spare row line RWL10 of the second group, and a second spare column line, which is the first spare column line RCL10 of the second group. The second row driving unit XDRV10 drives the second normal row line WL10 with the first voltage when the second memory cell MC1 is accessed.

For the first group, the first common row coupling unit FS0 selectively couples the first normal row line WL00 and the first spare row line RWL00 with each other based on whether the first memory cell MC0 is a failure memory cell or not when the first memory cell MC0 is accessed. For the second group, the first common row coupling unit FS0 selectively couples the second normal row line WL10 and the second spare row line RWL10 with each other based on whether the second memory cell MC1 is a failure memory cell or not when the second memory cell MC1 is accessed.

The first column driving unit YDRV00 drives the first spare column line RCL00 with the second voltage when the first memory cell MC0 is accessed. The first column coupling unit RS00 selectively couples the first spare column line RCL00 and the first normal column line CL00 with each other based on whether the first memory cell MC0 is a failure memory cell or not when the first memory cell MC0 is accessed.

The second column driving unit YDRV10 drives the second spare column line RCL10 with the second voltage when the second memory cell MC1 is accessed. The second column coupling unit RS10 selectively couples the second spare column line RCL10 and the second normal column line CL10 with each other based on whether the second memory cell MC1 is a failure memory cell or not when the second memory cell MC1 is accessed.

The first common row coupling unit FS0 may include a fuse F0, a first switch SW00, a second switch SW01, a third switch SW02, and a fourth switch SW03. The fuse F0 is coupled to and disposed between a common node CCN and a first access node CN0 on a side of the first group and between the common node CCN and a second access node CN1 on a side of the second group. The first normal row line WL00 is coupled at the common node CCN with the second normal row line WL10.

The first switch SW00 is coupled to and disposed between the first spare row line RWL00 and the first access node CN0 and switches according to whether the first memory cell MC0 is a failure memory cell or not when the first memory cell MC0 is accessed. The second switch SW01 is coupled to and disposed between the second spare row line RWL10 and the second access node CN1 and switches according to whether the second memory cell MC1 is a failure memory cell or not when the second memory cell MC1 is accessed.

The third switch SW02 is coupled to and disposed between the first spare row line RWL00 and the ground voltage end VSS and switches according to whether or not a first program operation is performed on the fuse F0. The fourth switch SW03 is coupled to and disposed between the second spare row line RWL10 and the ground voltage end VSS and switches according to whether or not a second program operation is performed on the fuse F0.

The fuse F0 may include an electrical fuse (e-fuse) or an anti-fuse. For example, the fuse F0 may include a MOS transistor having a gate coupled to the first normal row line WL00 and the second normal row line WL10, i.e., the common node CCN, a first junction end, which is one of a source and a drain and coupled to the first access node CN0, and a second junction end, which is the other of the source and the drain and coupled to the second access node CN1. In casein implementation, whether to program the fuse F0 through the first program operation may be decided based on a voltage difference between the first access node CN0 and the first normal row line WL00.

For example, the fuse F0 may be programmed through the first program operation when a third voltage is applied to the first normal row line WL00, the ground voltage VSS is applied to the first access node CN0, and thus a dielectric layer disposed between the gate and the first junction end of the fuse F0 is broken down. As the fuse F0 is programmed through the first program operation, the first normal row line WL00 and the first access node CN0 may be electrically connected to each other. Whether to perform the second program operation on the fuse F0 may be decided based on a voltage difference between the second normal row line WL10 and the second access node CN1. For example, the second program operation may be performed on the fuse F0 when the third voltage is applied to the second normal row line WL10, the ground voltage VSS is applied to the second access node CN1, and thus a dielectric layer disposed between the gate and the second junction end of the fuse F0 is broken down. As the fuse F0 is programmed through the second program operation, the second normal row line WL10 and the second access node CN1 may be electrically connected to each other.

The first switch SW00 may selectively couple the first access node CN0 and the first spare row line RWL00 with each other in response to a first row selection signal XSEL<00>. For example, when the first memory cell MC0 is accessed and the first memory cell MC0 is a failure memory cell, the first switch SW00 may couple the first access node CN0 and the first spare row line RWL00 with each other. Conversely, when the first memory cell MC0 is accessed and the first memory cell MC0 is a normal memory cell, the first switch SW00 may not couple the first access node CN0 and the first spare row line RWL00 with each other. Also, when the first program operation is performed, the first switch SW00 may couple the first access node CN0 and the first spare row line RWL00 with each other.

In an implementation, the first row selection signal XSEL<00> may be an internal signal that is generated in the memory circuit 200 based on the first row address X0_ADD. For example, the first row selection signal XSEL<00> may be enabled when the first memory cell MC0 is accessed and the first memory cell MC0 is a failure memory cell, and the first row selection signal XSEL<00> may be also enabled when the first program operation is performed in the test mode.

The second switch SW01 may selectively couple the second access node CN1 and the second spare row line RWL10 with each other in response to a second row selection signal XSEL<01>. To give an example, when the second memory cell MC1 is accessed and the second memory cell MC1 is a failure memory cell, the second switch SW01 may couple the second access node CN1 and the second spare row line RWL10 with each other. Conversely, when the second memory cell MC1 is accessed and the second memory cell MC1 is a normal memory cell, the second switch SW01 may not couple the second access node CN1 and the second spare row line RWL10 with each other. Also, the second switch SW01 may couple the second access node CN1 and the second spare row line RWL10 with each other during the second program operation.

In an implementation, the second row selection signal XSEL<01> may be an internal signal generated in the memory circuit 200 based on a second row address X1_ADD. For example, the second row selection signal XSEL<01> may be enabled when the second memory cell MC1 is accessed and the second memory cell MC1 is a failure memory cell, and it may be also enabled when the second program operation is performed in the test mode.

The third switch SW02 may selectively couple the first spare row line RWL00 and the ground voltage end VSS with each other in response to a first program enable signal EN_REPAIR<00>. To give an example, when the first program operation is performed on the fuse F0, the third switch SW02 may couple the first spare row line RWL00 and the ground voltage end VSS with each other. Conversely, when the first program operation is not performed on the fuse F0, the third switch SW02 may not couple the first spare row line RWL00 and the ground voltage end VSS with each other. In an implementation, the first program enable signal EN_REPAIR<00> may be an external signal inputted from outside the memory circuit 200 or an internal signal generated in the memory circuit 200 during a predetermined mode. For example, the first program enable signal EN_REPAIR<00> may be enabled when the fuse F0 is programmed through the first program operation in the test mode.

The fourth switch SW03 may selectively couple the second spare row line RWL10 and the ground voltage end VSS with each other in response to a second program enable signal EN_REPAIR<10>. To give an example, when the second program operation is performed on the fuse F0, the fourth switch SW03 may couple the second spare row line RWL10 and the ground voltage end VSS with each other. Conversely, when the second program operation is not performed on the fuse F0, the fourth switch SW03 may not couple the second spare row line RWL10 and the ground voltage end VSS with each other. In an implementation, the second program enable signal EN_REPAIR<10> may be an external signal inputted from outside or an internal signal generated in the memory circuit 200 during a predetermined mode. For example, the second program enable signal EN_REPAIR<10> may be enabled when the fuse F0 is programmed through the second program operation in the test mode.

Hereafter, operations of the memory circuit 200 having the above-described structure is described. For the sake of convenience of description, operations of the memory circuit 200 are described with reference to the structure of FIG. 4.

In a first stage of the test mode, the first memory cell MC0 and the second memory cell MC1 are tested to determine whether the first memory cell MC0 and the second memory cell MC1 are failure memory cells or not. For example, the first memory cell MC0 and the second memory cell MC1 are tested during the first stage of the test mode by writing predetermined data in the first memory cell MC0 and the second memory cell MC1 and then reading out the predetermined data from the first memory cell MC0 and the second memory cell MC1.

Subsequently, if the first memory cell MC0 is determined to be a failure memory cell, the memory circuit 200 may perform a first program operation on the fuse F0 during a second stage of the test mode. When the second stage of the test mode begins, the first row driving unit XDRV00 may drive the first normal row line WL00 with a third voltage to perform the first program operation, and the first switch SW00 may couple the first access node CN0 and the first spare row line RWL00 with each other based on the first row selection signal XSEL<00>. At this time, the third switch SW02 may couple the first spare row line RWL00 and the ground voltage end VSS with each other based on the first program enable signal EN_REPAIR<00>. One end of the fuse F0 then falls in a low resistance state, and thus the fuse F0 mediates the first normal row line WL00 and the first access node CN0 to be electrically connected to each other.

Meanwhile, if the second memory cell MC1 is determined to be a failure memory cell, the memory circuit 200 may perform a second program operation on the fuse F0 during the second stage of the test mode. When the second stage of the test mode begins, the second row driving unit XDRV10 may drive the second normal row line WL10 with the third voltage, and the second switch SW01 may couple the second access node CN1 and the second spare row line RWL10 with each other based on the second row selection signal XSEL<01>, and the fourth switch SW03 may couple the second spare row line RWL10 and the ground voltage end VSS with each other based on the second program enable signal EN_REPAIR<10>. The other end of the fuse F0 then falls in a low resistance state, and thus the fuse F0 mediates the second normal row line WL10 and the second access node CN1 to be electrically connected to each other.

Subsequently, when a normal mode begins and the first memory cell MC0 is accessed, the memory circuit 200 may select the first memory cell MC0 or the first spare cell SC0 based on whether the first memory cell MC0 is a failure memory cell or not.

If the first memory cell MC0 is a failure memory cell, the first spare cell SC0 may be selected instead of the first memory cell MC0. To be specific, when the first row driving unit XDRV00 drives the first normal row line WL00 with the first voltage, the first switch SW00 may electrically couple the first access node CN0 and the first spare row line RWL00 with each other in response to the first row selection signal XSEL<00>. In an implementation, the first row selection signal XSEL<00> may be designed to be enabled when the first row driving unit XDRV00 is enabled and the first memory cell MC0 is a failure memory cell. As a result, the first voltage may be transmitted to the first spare row line RWL00 through the first normal row line WL00 and the first common row coupling unit FS0. When the first column driving unit YDRV00 drives the first spare column line RCL00 with the second voltage, the first column coupling unit RS00 may electrically disconnect the first spare column line RCL00 from the first normal column line CL00 in response to the first column selection signal YSEL<00>. In an implementation, the first column selection signal YSEL<00> may be designed to be disabled when the first column driving unit YDRV00 is enabled and the first memory cell MC0 is a failure memory cell. As a result, the second voltage may be applied only to the first spare column line RCL00, and the first column coupling unit RS00 may prevent the second voltage from being transmitted to the first normal column line CL00. Therefore, when the first memory cell MC0 is accessed and the first memory cell MC0 is a failure memory cell, the first spare cell SC0 disposed at the cross point of the first spare row line RWL00 to which the first voltage is applied and the first spare column line RCL00 to which the second voltage is applied may be selected instead of the first memory cell MC0.

On the other hand, if the first memory cell MC0 is not a failure memory cell, i.e., the first memory cell MC0 is a normal memory cell, the first memory cell MC0 may be selected. To be specific, when the first row driving unit XDRV00 drives the first normal row line WL00 with the first voltage, the first switch SW00 may electrically disconnect the first access node CN0 and the first spare row line RWL00 from each other in response to the first row selection signal XSEL<00>. In an implementation, the first row selection signal XSEL<00> may be designed to be disabled when the first row driving unit XDRV00 is enabled and the first memory cell MC0 is a normal memory cell. As a result, the first voltage may be applied only to the first normal row line WL00, and the first row coupling unit FS0 may prevent the first voltage from being transmitted to the first spare row line RWL00.

Also, when the first column driving unit YDRV00 drives the first spare column line RCL00 with the second voltage, the first column coupling unit RS00 may electrically couple the first spare column line RCL00 and the first normal column line CL00 with each other in response to the first column selection signal YSEL<00>. In an implementation, the first column selection signal YSEL<00> may be designed to be enabled when the first column driving unit YDRV00 is enabled and the first memory cell MC0 is a normal memory cell. Therefore, when the first memory cell MC0 is accessed and the first memory cell MC0 is not a failure memory cell, the first memory cell MC0 disposed at the cross point of the first normal row line WL00 to which the first voltage is applied and the first normal column line CL00 to which the second voltage is applied may be selected.

In the meantime, when the normal mode begins and the second memory cell MC1 is accessed, the memory circuit 200 may select the second memory cell MC1 or the second spare cell SC1 based on whether the second memory cell MC1 is a failure memory cell or not.

If the second memory cell MC1 is a failure memory cell, the second spare cell SC1 may be selected instead of the second memory cell MC1. To be specific, when the second row driving unit XDRV10 drives the second normal row line WL10 with the first voltage, the second switch SW01 may electrically couple the second access node CN1 and the second spare row line RWL10 with each other in response to the second row selection signal XSEL<01>. In an implementation, the second row selection signal XSEL<01> may be designed to be enabled when the second row driving unit XDRV10 is enabled and the second memory cell MC1 is a failure memory cell. As a result, the first voltage may be transmitted to the second spare row line RWL10 through the second normal row line WL10 and the first common row coupling unit FS0. When the second column driving unit YDRV10 drives the second spare column line RCL10 with the second voltage, the second column coupling unit RS10 may electrically disconnect the second spare column line RCL10 from the second normal column line CL10 in response to the second column selection signal YSEL<10>. In an implementation, the second column selection signal YSEL<10> may be designed to be disabled when the first column driving unit YDRV10 is enabled and the second memory cell MC1 is a failure memory cell. As a result, the second voltage may be applied only to the second spare column line RCL10, and the second column coupling unit RS10 may prevent the second voltage from being transmitted to the second normal column line CL10. Therefore, when the second memory cell MC1 is accessed and the second memory cell MC1 is a failure memory cell, the second spare cell SC1 disposed at the cross point of the second spare row line RWL10 to which the first voltage is applied and the second spare column line RCL10 to which the second voltage is applied may be selected instead of the second memory cell MC1.

When the second memory cell MC1 is not a failure memory cell, the second memory cell MC1 may be selected. To be specific, when the second row driving unit XDRV10 drives the second normal row line WL10 with the first voltage, the second switch SW01 may electrically disconnect the second access node CN1 from the second spare row line RWL10 in response to the second row selection signal XSEL<01>. In an implementation, the second row selection signal XSEL<01> may be designed to be disabled when the second row driving unit XDRV10 is enabled and the second memory cell MC1 is a normal memory cell. As a result, the first voltage may be applied only to the second normal row line WL10, and the first common row coupling unit FS0 may prevent the first voltage from being transmitted to the second spare row line RWL10. Also, when the second column driving unit YDRV10 drives the second spare column line RCL10 with the second voltage, the second column coupling unit RS10 may electrically connect the second spare column line RCL10 and the second normal column line CL10 with each other in response to the second column selection signal YSEL<10>. In an implementation, the second column selection signal YSEL<10> may be designed to be enabled when the second column driving unit YDRV10 is enabled and the second memory cell MC1 is a normal memory cell. Therefore, when the second memory cell MC1 is accessed and the second memory cell MC1 is not a failure memory cell, the second memory cell MC1 disposed at the cross point of the second normal row line WL10 to which the first voltage is applied and the second normal column line CL10 to which the second voltage is applied may be selected.

Figure 5:
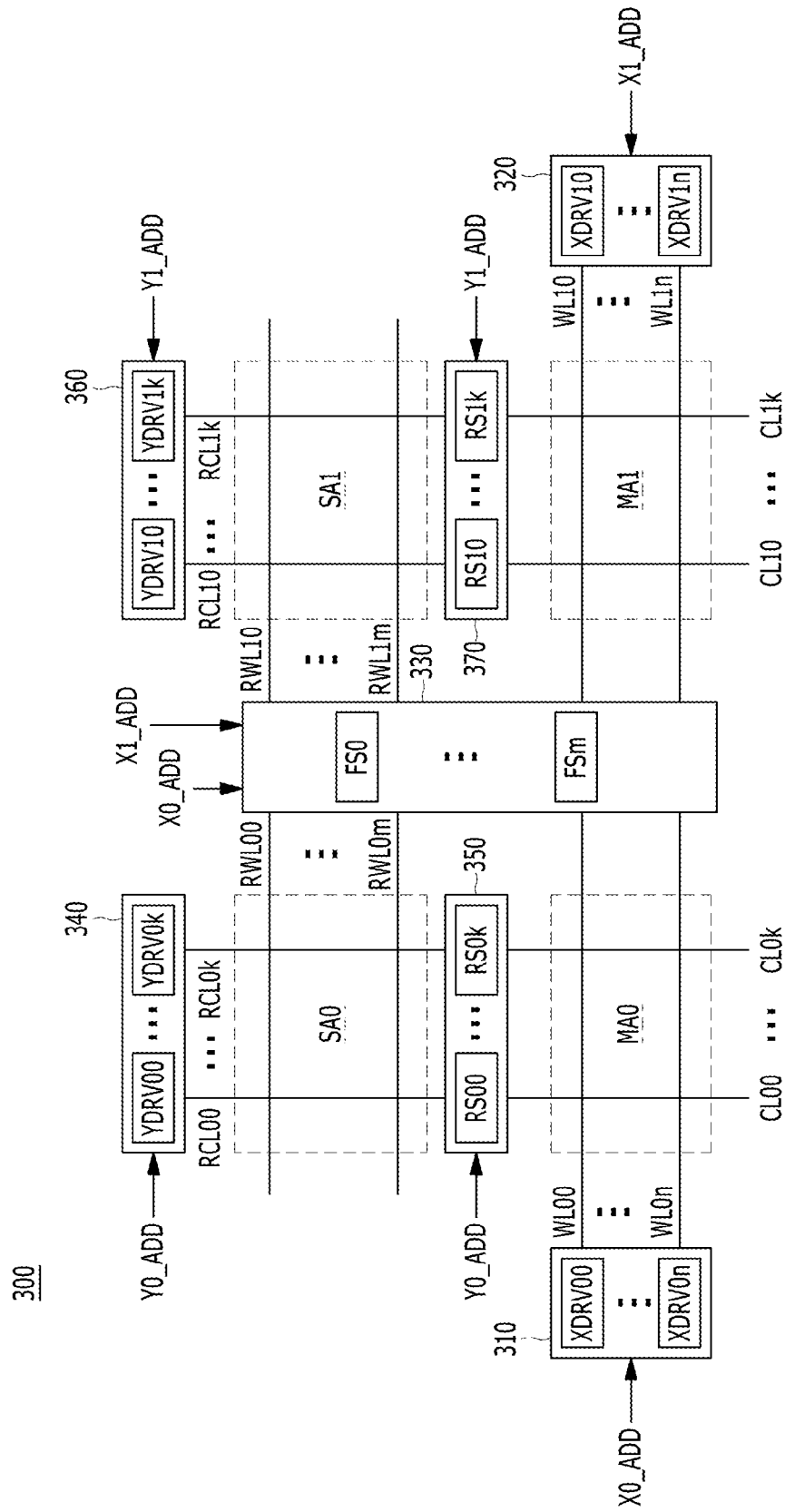
FIG. 5 is a block diagram illustrating a memory circuit in accordance with a third implementation of the present disclosure.

FIG. 5 is a block diagram illustrating a memory circuit in accordance with a third implementation of the present disclosure.

Referring to FIG. 5, the memory circuit 300 may include a first memory area MA0, a first spare area SA0, a first row driving block 310, a second memory area MA1, a second spare area SA1, a second row driving block 320, a row coupling block 330, a first column driving block 340, a first column coupling block 350, a second column driving block 360, and a second column coupling block 370. In this implementation, the first memory area MA0, the first spare area SA0, the first row driving block 310, the second memory area MA1, the second spare area SA1, the second row driving block 320, the row coupling block 330, the first column driving block 340, the first column coupling block 350, the second column driving block 360, and the second column coupling block 370 are the same as the first memory area MA0, the first spare area SA0, the first row driving block 210, the second memory area MA1, the second spare area SA1, the second row driving block 220, the row coupling block 230, the first column driving block 240, the first column coupling block 250, the second column driving block 260, and the second column coupling block 270, respectively, of the second implementation of the present disclosure shown in FIG. 3. Therefore, descriptions thereof are not duplicated herein.

In the third implementation of the present disclosure, normal row lines WL00 to WL0$n$ of a first group and spare row lines RWL00 to RWL0$m$ of the first group are in a one-to-many relationship, and normal row lines WL10 to WL1$n$ of a second group and spare row lines RWL10 to RWL1$m$ of the second group are also in a one-to-many relationship (n>m).

Figure 6:
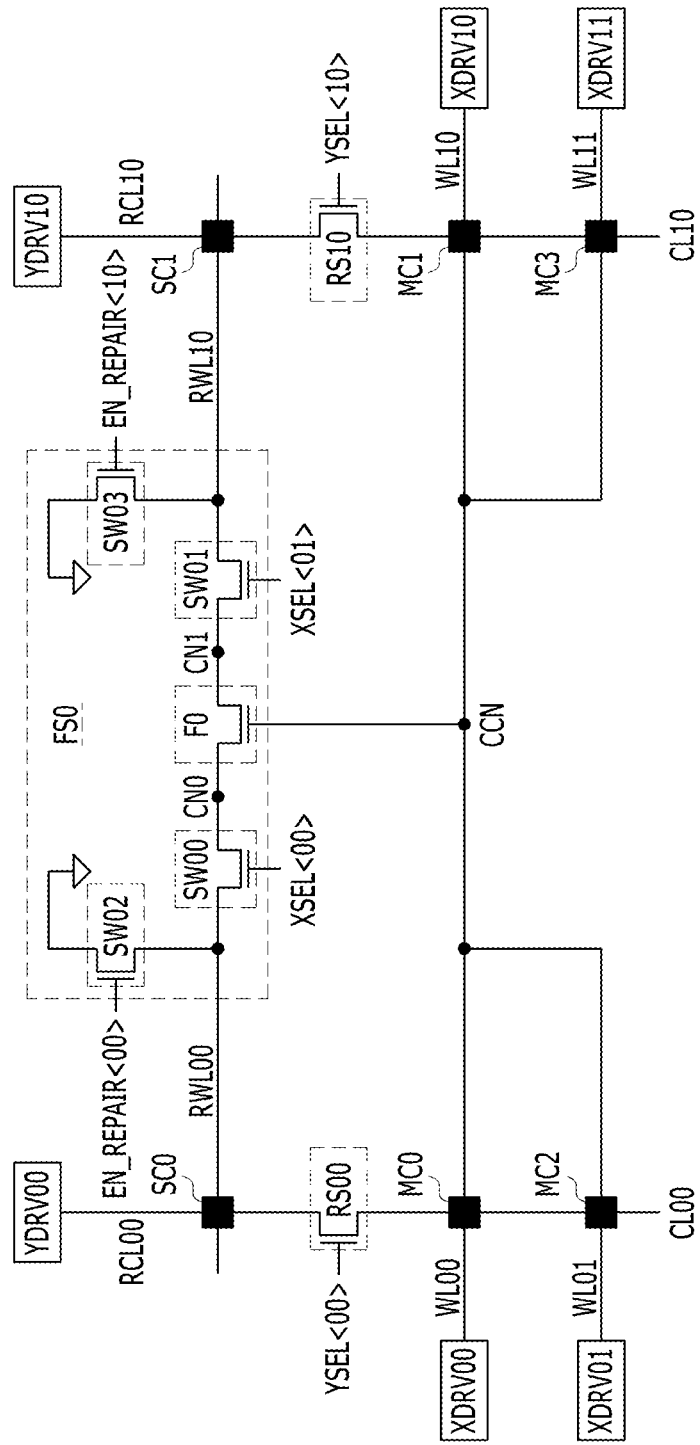
FIG. 6 is a schematic diagram illustrating a portion of the memory circuit shown in FIG. 5 in accordance with an implementation of the present disclosure.

FIG. 6 illustrates a portion of the memory circuit 300 shown in FIG. 5. For the sake of convenience of description, a case where the spare row lines RWL00 to RWL0$m$ of the first group and the normal row lines WL00 to WL0$n$ of the first group are in a one-to-two relationship and the spare row lines RWL10 to RWL1$m$ of the second group and the normal row lines WL10 to WL1$n$ of the second group are in a one-to-two relationship is taken as an example and described with reference to FIG. 6.

For the sake of convenience of description, parts MC0, MC2, SC0, XDRV00, XDRV01, MC1, MC3, SC1, XDRV10, XDRV11, FS0, YDRV00, RS00, YDRV10, and RS10 of the components MA0, SA0, 310, MA1, SA1, 320, 330, 340, 350, 360 and 370 of FIG. 5 are shown in FIG. 6.

Referring to FIG. 6, the memory circuit 300 may further include the third memory cell MC2, the third row driving unit XDRV01, the fourth memory cell MC3, and the fourth row driving unit XDRV11 in addition to the components described with reference to the second implementation of the present disclosure shown in FIG. 4.

The third memory cell MC2 is disposed at a cross point of a third normal row line, which is a second normal row line of a first group, and the first normal column line CL00. The third row driving unit XDRV01 drives the third normal row line WL01 with the first voltage when the third memory cell MC2 is accessed. In this implementation, the first group includes the first spare area SA0, the first memory area MA0, and elements related to operations of the first spare area SA0 and the first memory area MA0.

The fourth memory cell MC3 is disposed at a cross point of a fourth normal row line, which is a second normal row line WL11 of a second group, and the second normal column line CL10. The fourth row driving unit XDRV11 drives the fourth normal row line WL11 with the first voltage when the fourth memory cell MC3 is accessed. In this implementation, the second group includes the second spare area SA1, the second memory area MA1, and elements related to operations of the second spare area SA1 and the second memory area MA1.

In this case, the first common row coupling unit FS0 may replace two failure memory cells among the first to fourth memory cells MC0, MC1, MC2 and MC3 with first and second spare cells SC0 and SC1. In other words, assuming that there are two failure memory cells among the first to fourth memory cells MC0, MC1, MC2 and MC3, when a first failure memory cell, which is one memory cell with a failure among the first to fourth memory cells MC0, MC1, MC2 and MC3, is accessed, the first common row coupling unit FS0 may couple one of the first spare row line RWL00 and the second spare row line RWL10 with a first failure row line, which is a normal row line coupled to the first failure memory cell. Also, when a second failure memory cell, which is another memory cell with a failure among the first to fourth memory cells MC0, MC1, MC2 and MC3, is accessed, the first common row coupling unit FS0 may couple the other one of the first spare row line RWL00 and the second spare row line RWL10 with a second failure row line, which is a normal row line coupled to the second failure memory cell.

The first common row coupling unit FS0 may include a fuse F0, a first switch SW00, a second switch SW01, a third switch SW02, and a fourth switch SW03. The fuse F0 is coupled to and disposed between a common node CCN, which is coupled to the first to fourth normal row lines WL00, WL10, WL01 and WL11, and a first access node CN0 and between the common node CCN and a second access node CN1. The first switch SW00 is coupled to and disposed between the first spare row line RWL00 and the first access node CN0, and switches according to whether the first failure memory cell is accessed or not. The second switch SW01 is coupled to and disposed between the second spare row line RWL10 and the second access node CN1, and switches according to whether the second failure memory cell is accessed or not. The third switch SW02 is coupled to and disposed between the first spare row line RWL00 and the ground voltage end VSS, and switches according to whether the fuse F0 is programmed or not through a first program operation. The fourth switch SW03 is coupled to and disposed between the second spare row line RWL10 and the ground voltage end VSS, and switches according to whether the fuse F0 is programmed or not through a second program operation.

The fuse F0 may include an electrical fuse (e-fuse) or an anti-fuse. In an implementation, the fuse F0 may include a MOS transistor having a gate coupled to the common node CCN, a first junction end, which is one of a source and a drain and coupled to the first access node CN0, and a second junction end, which is the other of the source and the drain and coupled to the second access node CN1. In this case, whether to program the fuse F0 through the first program operation or not may be decided based on a voltage difference between the common node CCN and the first access node CN0. For example, the fuse F0 may be programmed through the first program operation when a third voltage is applied to at least one of the first and third normal row lines WL00 and WL01, the ground voltage VSS is applied to the first access node CN0, and thus a dielectric layer disposed between the gate and the first junction end of the fuse F0 is broken down. Through the first program operation, the first normal row line WL00 and the third normal row line WL01 may be electrically coupled with the first access node CN0.

Whether to perform the second program operation on the fuse F0 may be decided based on a voltage difference between the common node CCN and the second access node CN1. For example, the second program operation may be performed on the fuse F0 when the third voltage is applied to at least one of the second normal row line WL10 and the fourth normal row line WL11, the ground voltage VSS is applied to the second access node CN1, and thus a dielectric layer disposed between the gate and the second junction end of the fuse F0 is broken down. Through the second program operation, the second and fourth normal row lines WL10 and WL11 may be electrically coupled with the second access node CN1.

The first switch SW00 may selectively couple the first access node CN0 and the first spare row line RWL00 with each other in response to a first row selection signal XSEL<00>. For example, when the first failure memory cell is accessed, the first switch SW00 may couple the first access node CN0 and the first spare row line RWL00 with each other. Conversely, when any of the first to fourth memory cells MC0, MC1, MC2 and MC3 is accessed and the accessed one of the first to fourth memory cells MC0, MC1, MC2 and MC3 is not a failure memory cell, the first switch SW00 may not couple the first access node CN0 and the first spare row line RWL00 with each other.

Also, when the first program operation is performed on the fuse F0, the first switch SW00 may couple the first access node CN0 and the first spare row line RWL00 with each other. In an implementation, the first row selection signal XSEL<00> may be an internal signal that is generated in the memory circuit 300 based on the first and second row addresses X0_ADD and X1_ADD. For example, the first row selection signal XSEL<00> may be enabled when the first failure memory cell is accessed, and the first row selection signal XSEL<00> may be also enabled when the first program operation is performed in a test mode.

The second switch SW01 may selectively couple the second access node CN1 and the second spare row line RWL10 with each other in response to a second row selection signal XSEL<01>. To give an example, when the second failure memory cell is accessed, the second switch SW01 may couple the second access node CN1 and the second spare row line RWL10 with each other. Conversely, when any of the first to fourth memory cells MC0, MC1, MC2 and MC3 is accessed and the accessed one of the first to fourth memory cells MC0, MC1, MC2 and MC3 is not a failure memory cell, the second switch SW01 may not couple the second access node CN1 and the second spare row line RWL10 with each other.

Also, the second switch SW01 may couple the second access node CN1 and the second spare row line RWL10 with each other during the second program operation. In an implementation, the second row selection signal XSEL<01> may be an internal signal generated in the memory circuit 300 based on the first and second row addresses X0_ADD and X1_ADD. For example, the second row selection signal XSEL<01> may be enabled when the second failure memory cell is accessed, and the second row selection signal XSEL<01> may be also enabled when the second program operation is performed in the test mode.

The third switch SW02 may selectively couple the first spare row line RWL00 and the ground voltage end VSS with each other in response to a first program enable signal EN_REPAIR<00>. To give an example, when the first program operation is performed on the fuse F0, the third switch SW02 may couple the first spare row line RWL00 and the ground voltage end VSS with each other. Conversely, when the first program operation is not performed on the fuse F0, the third switch SW02 may not couple the first spare row line RWL00 and the ground voltage end VSS with each other. In an implementation, the first program enable signal EN_REPAIR<00> may be an external signal inputted from outside the memory circuit 300 or an internal signal generated in the memory circuit 300 during a predetermined mode. For example, the first program enable signal EN_REPAIR<00> may be enabled when the fuse F0 is programmed through the first program operation in the test mode.

The fourth switch SW03 may selectively couple the second spare row line RWL10 and the ground voltage end VSS with each other in response to a second program enable signal EN_REPAIR<10>. To give an example, when the second program operation is performed on the fuse F0, the fourth switch SW03 may couple the second spare row line RWL10 and the ground voltage end VSS with each other. Conversely, when the second program operation is not performed on the fuse F0, the fourth switch SW03 may not couple the second spare row line RWL10 and the ground voltage end VSS with each other. In an implementation, the second program enable signal EN_REPAIR<10> may be an external signal inputted from the outside or an internal signal generated in the memory circuit 300 during a predetermined mode. For example, the second program enable signal EN_REPAIR<10> may be enabled when the fuse F0 is programmed through the second program operation in the test mode.

Hereafter, an operation of the memory circuit 300 having the above-described structure is described. For the sake of convenience of description, the operation of the memory circuit 300 is described with reference to the structure of FIG. 6.

In a first stage of the test mode, the first to fourth memory cells MC0, MC1, MC2 and MC3 may be tested to determine whether the first to fourth memory cells MC0, MC1, MC2 and MC3 are failure memory cells or not. For example, in the first stage of the test mode, the first to fourth memory cells MC0, MC1, MC2 and MC3 are tested by writing predetermined data in the first to fourth memory cells MC0, MC1, MC2 and MC3 and then reading out the predetermined data from the first to fourth memory cells MC0, MC1, MC2 and MC3.

Subsequently, when it is determined in the first stage of the test mode that there is a first failure memory cell among the first to fourth memory cells MC0, MC1, MC2 and MC3, the memory circuit 300 may perform a first program operation during a second stage of the test mode. For example, when the second stage of the test mode begins, at least one of the first row driving unit XDRV00 and the third row driving unit XDRV01 may drive at least one of the first normal row line WL00 and the third normal row line WL01 with a third voltage for performing the first program operation. Thus, the first switch SW00 may couple the first access node CN0 and the first spare row line RWL00 with each other based on the first row selection signal XSEL<00>, and the third switch SW02 may couple the first spare row line RWL00 and the ground voltage end VSS with each other based on the first program enable signal EN_REPAIR<00>. As a result, one end of the fuse F0 then falls in a low resistance state, and thus the fuse F0 mediates the common node CCN and the first access node CN0 to be electrically connected to each other.

Meanwhile, when it is determined in the first stage of the test mode that there is a second failure memory cell among the first to fourth memory cells MC0, MC1, MC2 and MC3, the memory circuit 300 may perform a second program operation during the second stage of the test mode. For example, when the second stage of the test mode begins, at least one of the second row driving unit XDRV10 and the fourth row driving unit XDRV11 may drive at least one of the second normal row line WL10 and the fourth normal row line WL11 with the third voltage, and the second switch SW01 may couple the second access node CN1 and the second spare row line RWL10 with each other based on the second row selection signal XSEL<01>, and the fourth switch SW03 may couple the second spare row line RWL10 and the ground voltage end VSS with each other based on the second program enable signal EN_REPAIR<10>. As a result, the other end of the fuse F0 then falls in a low resistance state, and thus the fuse F0 mediates the common node CCN and the second access node CN1 to be electrically connected to each other.

Subsequently, when a normal mode begins and the first to fourth memory cells MC0, MC1, MC2 and MC3 are accessed, the memory circuit 300 may select the first to fourth memory cells MC0, MC1, MC2 and MC3 or the first and second spare cells SC0 and SC1 based on whether there is at least one of a first failure memory cell and a second failure memory cell.

If there is a first failure memory cell, the first spare cell SC0 may be selected instead of the first failure memory cell. Hereafter, for convenience of illustration, a case where the first memory cell MC0 is the first failure memory cell is used as an example and described. When the first row driving unit XDRV00 drives the first normal row line WL00 with the first voltage, the first switch SW00 may electrically couple the first access node CN0 and the first spare row line RWL00 with each other in response to the first row selection signal XSEL<00>. In an implementation, the first row selection signal XSEL<00> may be designed to be enabled when the first row driving unit XDRV00 is enabled and the first memory cell MC0 is a failure memory cell. As a result, the first voltage may be transmitted to the first spare row line RWL00 through the first normal row line WL00 and the first common row coupling unit FS0.

When the first column driving unit YDRV00 drives the first spare column line RCL00 with the second voltage, the first column coupling unit RS00 may electrically disconnect the first spare column line RCL00 from the first normal column line CL00 in response to the first column selection signal YSEL<00>. In an implementation, the first column selection signal YSEL<00> may be designed to be disabled when the first column driving unit YDRV00 is enabled and the first memory cell MC0 is the failure memory cell. As a result, the second voltage may be applied only to the first spare column line RCL00, and the first column coupling unit RS00 may prevent the second voltage from being transmitted to the first normal column line CL00. Therefore, when the first memory cell MC0 is accessed, the first spare cell SC0 disposed at the cross point of the first spare row line RWL00 to which the first voltage is applied and the first spare column line RCL00 to which the second voltage is applied may be selected instead of the first memory cell MC0.

If there is a second failure memory cell, the second spare cell SC1 may be selected instead of the second failure memory cell. Hereafter, for convenience of illustration, a case where the third memory cell MC2 is the second failure memory cell is used as an example and described. When the third row driving unit XDRV01 drives the third normal row line WL01 with the first voltage, the second switch SW01 may electrically couple the second access node CN1 and the second spare row line RWL10 in response to the second row selection signal XSEL<01>. In an implementation, the second row selection signal XSEL<01> may be designed to be enabled when the third row driving unit XDRV01 is enabled and the third memory cell MC2 is a failure memory cell. As a result, the first voltage may be transmitted to the second spare row line RWL10 through the third normal row line WL01 and the first common row coupling unit FS0.

When the second column driving unit YDRV10 drives the second spare column line RCL10 with the second voltage, the second column coupling unit RS10 may electrically disconnect the second spare column line RCL10 from the second normal column line CL10 in response to the second column selection signal YSEL<10>. In an implementation, the second column selection signal YSEL<10> may be designed to be disabled when the second column driving unit YDRV10 is enabled and the third memory cell MC2 is the failure memory cell. As a result, the second voltage may be applied only to the second spare column line RCL10, and the second column coupling unit RS10 may prevent the second voltage from being transmitted to the second normal column line CL10. Therefore, when the third memory cell MC2 is accessed, the second spare cell SC1 disposed at the cross point of the second spare row line RWL10 to which the first voltage is applied and the second spare column line RCL10 to which the second voltage is applied may be selected instead of the third memory cell MC2.

Meanwhile, implementations where the first to fourth memory cells MC0, MC1, MC2 and MC3 are not failure memory cells be ascertained from the description provided with reference to the second implementation of the present disclosure described above, descriptions thereof are not provided herein.

In FIG. 6, the first row driving unit XDRV00 and the third row driving unit XDRV01 are implemented to drive the first normal row line WL00 and the third normal row line WL01, respectively. However, implementations are not limited thereto. In another implementation, a single row driving unit may selectively drive the first normal row line WL00 and the third normal row line WL01.

Likewise, in FIG. 6, the second row driving unit XDRV10 and the fourth row driving unit XDRV11 are implemented to drive the second normal row line WL10 and the fourth normal row line WL11, respectively, but, in another implementation, a single row driving unit may selectively drive the second normal row line WL10 and the fourth normal row line WL11.

According to implementations of the present patent document, a failure memory cell of a cross-point array structure may be easily repaired. As a result, the throughput of an electronic device may be improved.

The above and other memory circuits or semiconductor devices based on the disclosed technology can be used in a range of devices or systems. FIGS. 7-11 provide some examples of devices or systems that can implement the memory circuits disclosed herein.

Figure 7:
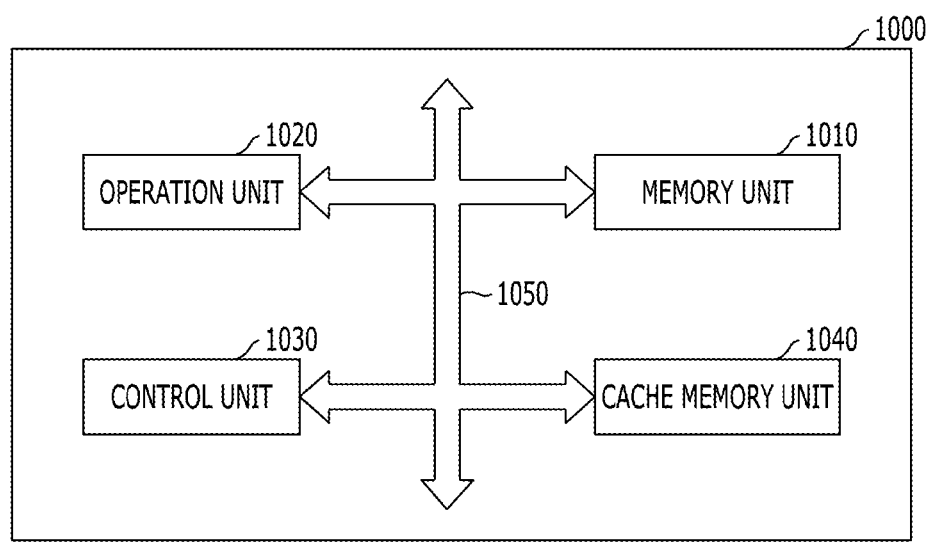
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed. As a consequence, a defective memory cell may be easily repaired, thereby improving the performance characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
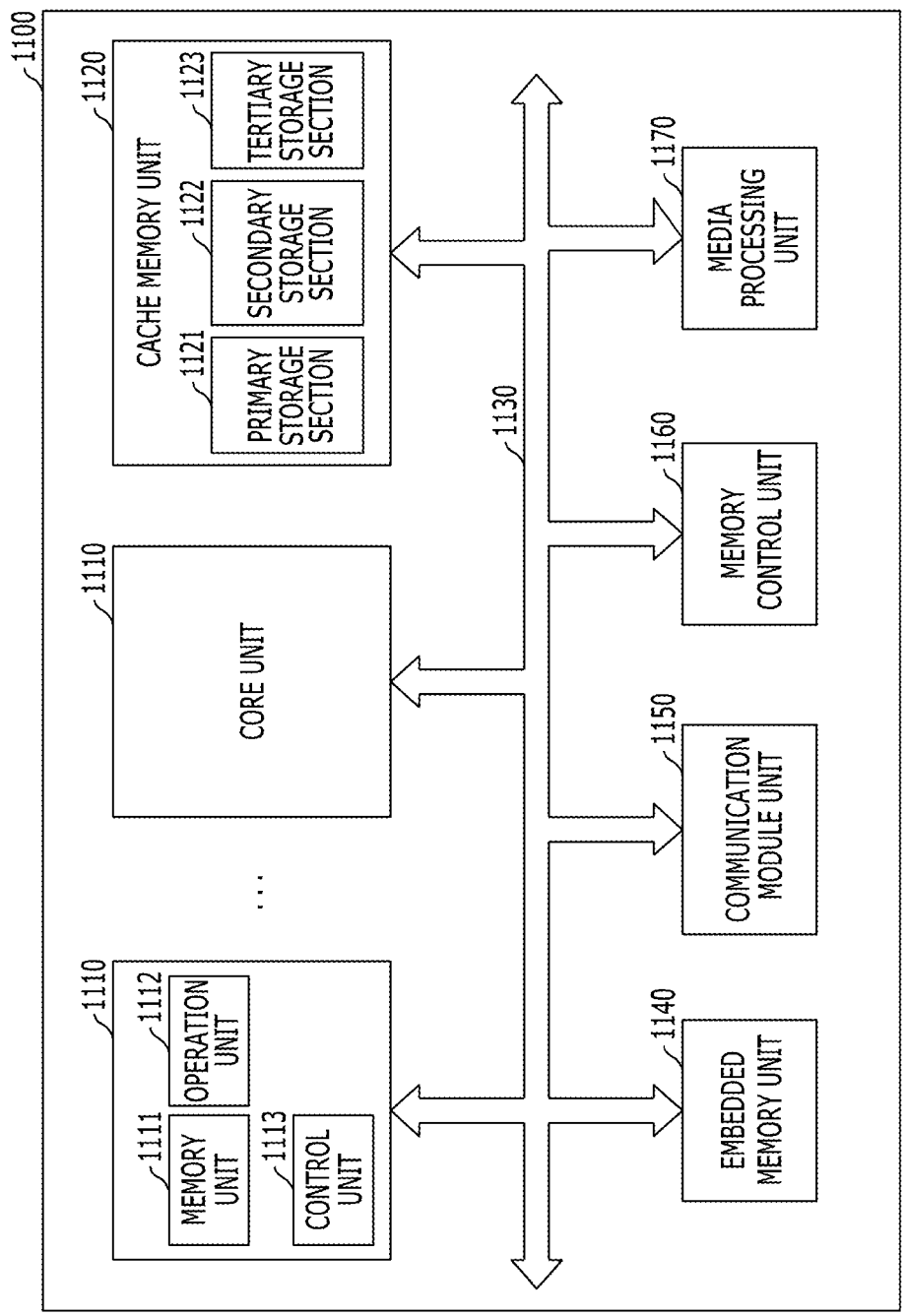
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed. As a consequence, a defective memory cell may be easily repaired, thereby improving the performance characteristics of the processor 1100.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
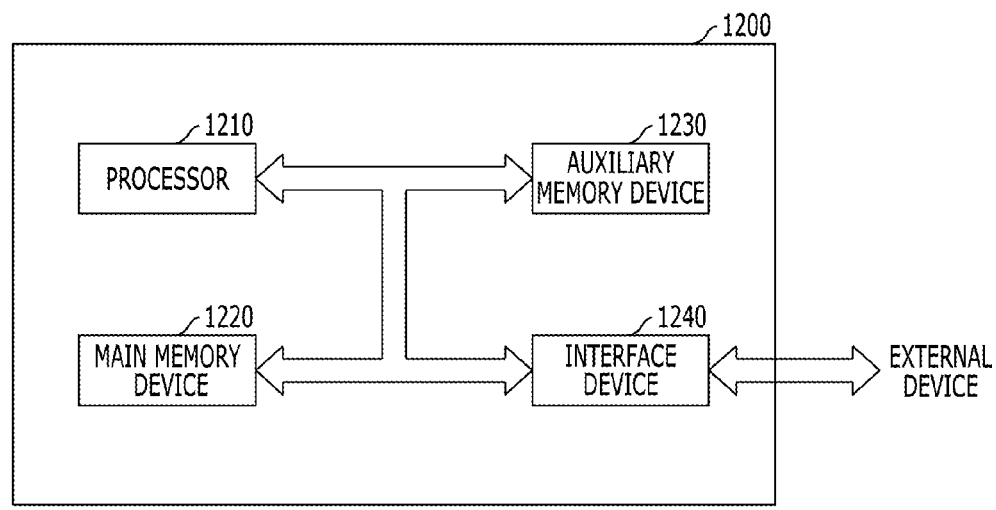
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed. As a consequence, a defective memory cell may be easily repaired, thereby improving the performance characteristics of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed. As a consequence, a defective memory cell may be easily repaired, thereby improving the performance characteristics of the system 1200.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
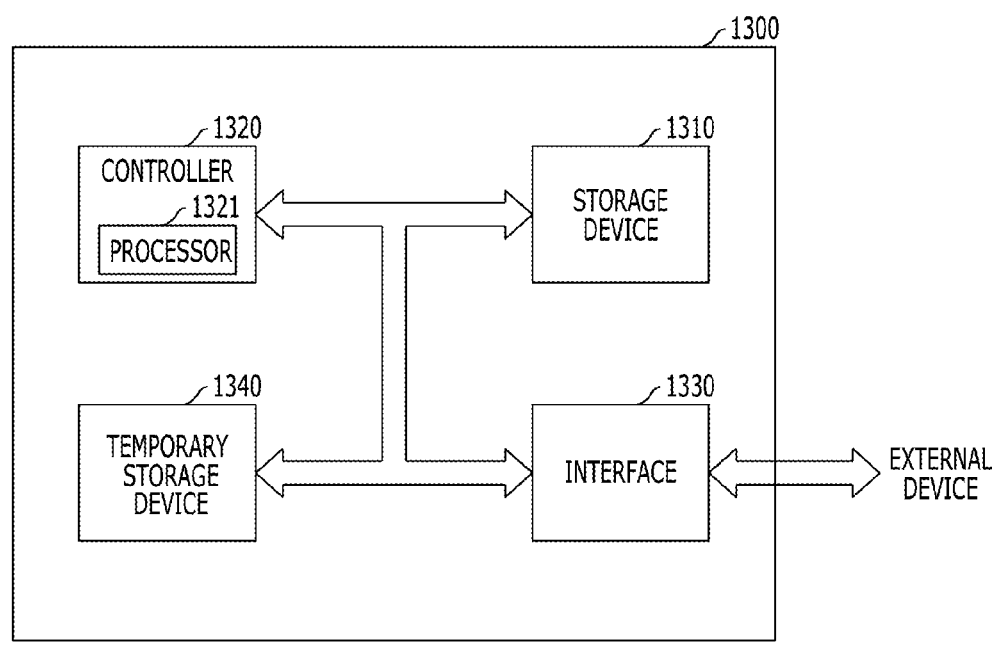
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed. As a consequence, a defective memory cell may be easily repaired, thereby improving the performance characteristics of the data storage system 1300.

Figure 11:
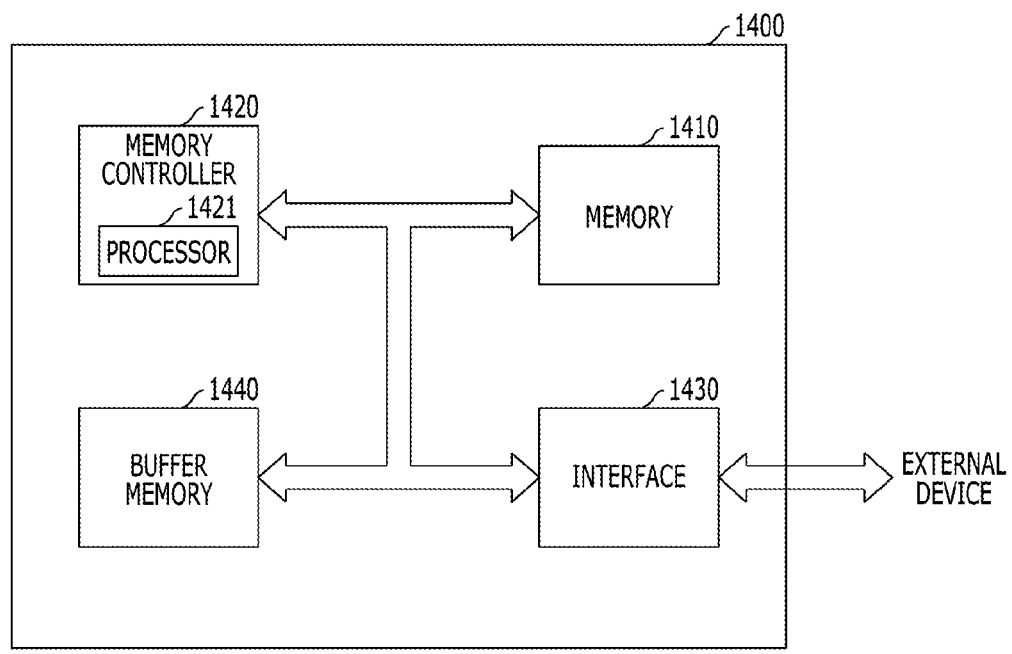
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed. As a consequence, a defective memory cell may be easily repaired, thereby improving the performance characteristics of the memory system 1400.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first access line coupled to a first memory cell; a second access line coupled to a second memory cell for replacing the first memory cell when the first memory cell is a failure memory cell; a first driving block coupled to one of the first access line and the second access line, and suitable for driving said one of the first access line and the second access line with a first voltage when the first memory cell is accessed; and a first repair coupling block suitable for selectively coupling the first access line and the second access line based on whether the first memory cell is a failure memory cell or not when the first memory cell is accessed. As a consequence, a defective memory cell may be easily repaired, thereby improving the performance characteristics of the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

For example, although the implementations of the present disclosure describe a structure where a repair operation is carried out based on the row lines, the spirit and concept of the present disclosure are not limited to it, and the technology of the implementations of the present disclosure may also be applied to a structure where a repair operation is carried out based on the column lines as well.

What is claimed is:

1. An electronic device comprising a semiconductor memory unit that comprises:
   a first access line coupled to a first memory cell;
   a first spare line coupled to a first spare cell for replacing the first memory cell when the first memory cell is a failure memory cell;
   a first driving block coupled to one of the first access line and the first spare line, and suitable for driving said one of the first access line and the first spare line with a first voltage when the first memory cell is accessed; and
   a first repair coupling block disposed between the first access line and the first spare line and suitable for selectively coupling the first access line and the first spare line based on whether the first memory cell is a failure memory cell or not when the first memory cell is accessed,
   wherein the first voltage is transmitted to the first access line and the first spare line through the first repair coupling block when the first access line is coupled with the first spare line, and is transmitted to one of the first access line and the first spare line when the first access line is decoupled from the first spare line.

2. The electronic device according to claim 1, wherein the first repair coupling block couples the first access line and the first spare line when the first memory cell is accessed and the first memory cell is a failure memory cell.

3. The electronic device according to claim 1, wherein the first access line and the first spare line are disposed in a first direction and in parallel to each other.

4. The electronic device according to claim 3, further comprising:

a second access line coupled to the first memory cell and disposed in a second direction that is perpendicular to the first direction;

a second spare line coupled to the first spare memory cell and disposed in the second direction;

a second driving block coupled to one of the second access line and the second spare line, and suitable for driving said one of the second access line and the second spare line with a second voltage when the first memory cell is accessed; and a second repair coupling block suitable for selectively coupling the second access line and the second spare line based on whether the first memory cell is a failure memory cell or not when the first memory cell is accessed.

5. The electronic device according to claim 4, wherein the first driving block is coupled to the first access line, and
the second driving block is coupled to the second spare line.

6. The electronic device according to claim 5, wherein
when the first memory cell is accessed and the first memory cell is a failure memory cell, the first repair coupling block couples the first access line and the first spare line and the second repair coupling block decouples the second access line and the second spare line, and
when the first memory cell is accessed and the first memory cell is a normal memory cell, the first repair coupling block decouples the first access line and the first spare line, and the second repair coupling block couples the second access line and the second spare line.

7. The electronic device according to claim 1, wherein the first repair coupling block includes:
a fuse coupled to and disposed between an access node and a first one of the first access line and the first spare line, which is an access line coupled to the first driving block; and
a first switch coupled to and disposed between the access node and a second one of the first access line and the first spare line, which is an access line that is not coupled to the first driving block, and switching based on whether the first memory cell is a failure memory cell or not when the first memory cell is accessed.

8. The electronic device according to claim 7, wherein the first repair coupling block further includes:
a second switch coupled to and disposed between a ground voltage end and the second one of the first access line and the first spare line, and switching based on whether the fuse is programmed or not.

9. The electronic device according to claim 8, wherein
when the fuse is programmed, the second switch couples the ground voltage end with the second one of the first access line and the first spare line, the first switch couples the access node with the second one of the first access line and the first spare line, and the first driving block drives the first one of the first access line and the first spare line with a third voltage.

10. An electronic device comprising a semiconductor memory unit that comprises:
a first access line coupled to a first memory cell of a first memory area;
a second access line coupled to a second memory cell of a second memory area;
a first spare line coupled to a first spare cell of a first spare area;

a second spare line coupled to a second spare cell of a second spare area;

a first driving block coupled to one of the first access line and the first spare line, and suitable for driving said one of the first access line and the first spare line with a first voltage when the first memory cell is accessed;

a second driving block coupled to one of the second access line and the second spare line, and suitable for driving said one of the second access line and the second spare line with the first voltage when the second memory cell is accessed; and a first repair coupling block disposed between the first and second access lines and the first and second spare lines and suitable for coupling the first access line and the first spare line when the first memory cell is accessed and the first memory cell is a failure memory cell, and coupling the second access line and the second spare line when the second memory cell is accessed and the second memory cell is a failure memory cell, wherein the first voltage is transmitted to the first access line and the first spare line through the first repair coupling block when the first access line is coupled with the first spare line, and is transmitted to one of the first access line and the first spare line when the first access line is decoupled from the first spare line, and wherein the first voltage is transmitted to the second access line and the second spare line through the first repair coupling block when the second access line is coupled with the second spare line, and is transmitted to one of the second access line and the second spare line when the second access line is decoupled from the second spare line.

11. The electronic device according to claim 10, wherein the first access line and the second access line are disposed in a first direction and in parallel to the first spare line and the second spare line, respectively.

12. The electronic device according to claim 11, further comprising:
a third access line coupled to the first memory cell and disposed in a second direction that is perpendicular to the first direction;
a third spare line coupled to the first spare cell and disposed in the second direction;
a third driving block coupled to one of the third access line and the third spare line, and suitable for driving said one of the third access line and the third spare line with a second voltage when the first memory cell is accessed;
a second repair coupling block suitable for selectively coupling the third access line and the third spare line based on whether the first memory cell is a failure memory cell or not when the first memory cell is accessed;
a fourth access line coupled to the second memory cell and disposed in the second direction;
a fourth spare line coupled to the second spare cell and disposed in the second direction;
a fourth driving block coupled to one of the fourth access line and the fourth spare line, and suitable for driving said one of the fourth access line and the fourth spare line with the second voltage when the second memory cell is accessed; and
a third repair coupling block suitable for selectively coupling the fourth access line and the fourth spare line with each other based on whether the second memory cell is a failure memory cell or not when the second memory cell is accessed.

13. The electronic device according to claim 12, wherein
the first driving block is coupled to the first access line, and
the second driving block is coupled to the second access line,
the third driving block is coupled to the third spare line, and
the fourth driving block is coupled to the fourth spare line.

14. The electronic device according to claim 13, wherein when the first memory cell is accessed and the first memory cell is a failure memory cell, the second repair coupling block decouples the third access line and the third spare line, and
when the first memory cell is accessed and the first memory cell is a normal memory cell, the second repair coupling block couples the third access line and the third spare line,
when the second memory cell is accessed and the second memory cell is a failure memory cell, the third repair coupling block decouples the fourth access line and the fourth spare line, and
when the second memory cell is accessed and the second memory cell is a normal memory cell, the third repair coupling block couples the fourth access line and the fourth spare line.

15. The electronic device according to claim 10, wherein the first repair coupling block includes:
a fuse coupled to and disposed between a first access node and a first one of the first access line and the first spare line, which is a line coupled to the first driving block, and coupled to and disposed between a second access node and a first one of the second access line and the second spare line, which is a line coupled to the second driving block;
a first switch coupled to and disposed between the first access node and a second one of the first access line and the first spare line, which is a line that is not coupled with the first driving block, and switching based on whether the first memory cell is a failure memory cell or not when the first memory cell is accessed; and
a second switch coupled to and disposed between the second access node and a second one of the second access line and the second spare line, which is a line not coupled to the second driving block, and switching based on whether the second memory cell is a failure memory cell or not when the second memory cell is accessed.

16. The electronic device according to claim 15, wherein the fuse includes a transistor provided with:
a gate coupled to the first access line and the second access line;
a first junction end coupled to the first access node; and
a second junction end coupled to the second access node.

17. The electronic device according to claim 15, wherein the first repair coupling block further includes:
a third switch coupled to and disposed between a ground voltage end and the second one of the first access line and the first spare line, and switching based on whether a first program operation is performed on the fuse or not; and
a fourth switch coupled to and disposed between the ground voltage end and the second one of the second access line and the second spare line, and switching based on whether a second program operation is performed on the fuse or not.

18. The electronic device according to claim 17, wherein when the first program operation is performed, the third switch couples the ground voltage end to the second one of the first access line and the first spare line, the first switch couples the first access node to the second one of the first access line and the first spare line, and the first driving block drives the first one of the first access line and the first spare line with a third voltage.

19. The electronic device according to claim 17, wherein when the second program operation is performed, the fourth switch couples the ground voltage end to the second one of the second access line and the second spare line, the second switch couples the second access node to the second one of the second access line and the second spare line, and the second driving block drives the first one of the second access line and the second spare line with a third voltage.

20. An electronic device comprising a semiconductor memory unit that comprises:
a first access line coupled to a first memory cell of a first memory area;
a second access line coupled to a second memory cell of the first memory area and disposed in parallel to the first access line;
a third access line coupled to a third memory cell of a second memory area;
a fourth access line coupled to a fourth memory cell of the second memory area and disposed in parallel to the third access line;
a first spare line coupled to a first spare cell of a first spare area;
a second spare line coupled to a second spare cell of a second spare area;
a first driving block coupled to the first access line and the second access line, and suitable for driving the first access line or the second access line with a first voltage when the first memory cell or the second memory cell is accessed, respectively;
a second driving block coupled to the third access line and the fourth access line, and suitable for driving the third access line or the fourth access line with the first voltage when the third memory cell or the fourth memory cell is accessed, respectively; and
a first repair coupling block disposed between the first to fourth access lines and the first and second spare lines and suitable for coupling one of the first spare line and the second spare line with a first failure line, wherein the first failure line is one of the first to fourth access lines coupled to a first failure memory cell that is a memory cell with a failure among the first to fourth memory cells when the first failure memory cell is accessed, and coupling the other one of the first spare line and the second spare line to a second failure line, wherein the second failure line is another one of the first to fourth access lines coupled to a second failure memory cell that is another memory cell with a failure among the first to fourth memory cells when the second failure memory cell is accessed,
wherein the first voltage is transmitted to the first failure line and said one of the first spare line and the second spare line through the first repair coupling block when said one of the first spare line and the second spare line is coupled to the first failure line, and is transmitted to said one of the first to fourth access lines when said one of the first spare line and the second spare line is decoupled from said one of the first to fourth access lines, and wherein the first voltage is transmitted to the second failure line and the other one of the first spare line and the second spare line through the first repair coupling block when the other one of the first spare line and the second spare line is coupled to the second failure line, and is transmitted to the other one of the first to fourth access lines when the other one of the first spare line and the second spare line is decoupled from the other one of the first to fourth access lines.

21. The electronic device according to claim 20, wherein the first access line and the second access line are disposed in a first direction and in parallel to the first spare line and the second spare line, respectively.

22. The electronic device according to claim 21, further comprising:
- a fifth access line coupled to the first memory cell and the second memory cell and disposed in a second direction that is perpendicular to the first direction;
- a third spare line coupled to the first spare cell and disposed in the second direction;
- a third driving block coupled with the third spare line, and suitable for driving the third spare line with a second voltage when the first memory cell, the second memory cell, or the first failure memory cell is accessed;
- a second repair coupling block suitable for selectively coupling the fifth access line and the third spare line based on which one of the first memory cell, the second memory cell, and the first failure memory cell is accessed;
- a sixth access line coupled to the third memory cell and the fourth memory cell and disposed in the second direction;
- a fourth spare line coupled to the second spare cell and disposed in the second direction;
- a fourth driving block coupled to the fourth spare line, and suitable for driving the fourth spare line with the second voltage when the third memory cell, the fourth memory cell, or the second failure memory cell is accessed; and
- a third repair coupling block suitable for selectively coupling the sixth access line and the fourth spare line based on which one of the third memory cell, the fourth memory cell, and the second failure memory cell is accessed.

23. The electronic device according to claim 22, wherein
when one of the first memory cell, the second memory cell, the third memory cell, and the fourth memory cell is accessed and the accessed one of the first memory cell, the second memory cell, the third memory cell, and the fourth memory cell is the first failure memory cell, the second repair coupling block decouples the fifth access line and the third spare line,
when one of the first memory cell and the second memory cell is accessed and the accessed one of the first memory cell and the second memory cell is a normal memory cell, the second repair coupling block couples the fifth access line and the third spare line,
when one of the third memory cell and the fourth memory cell is accessed and the accessed one of the third memory cell and the fourth memory cell is a normal memory cell, the second repair coupling block decouples the fifth access line and the third spare line,
when one of the first memory cell, the second memory cell, the third memory cell, and the fourth memory cell is accessed and the accessed one of the first memory cell, the second memory cell, the third memory cell, and the fourth memory cell is the second failure memory cell, the third repair coupling block decouples the sixth access line and the fourth spare line,
when one of the first memory cell and the second memory cell is accessed and the accessed one of the first memory cell and the second memory cell is a normal memory cell, the third repair coupling block decouples the sixth access line and the fourth spare line, and when one of the third memory cell and the fourth memory cell is accessed and the accessed one of the third memory cell and the fourth memory cell is a normal memory cell, the third repair coupling block couples the sixth access line and the fourth spare line.

24. The electronic device according to claim 20, wherein the first repair coupling block includes:
- a fuse including a first end coupled to a common access node that is coupled to the first to fourth access lines, a second end coupled to a first access node, and a third end coupled to a second access node;
- a first switch coupled to and disposed between the first spare line and the first access node, and turned on when the first failure memory cell is accessed; and
- a second switch coupled to and disposed between the second spare line and the second access node, and turned on when the second failure memory cell is accessed.

25. The electronic device according to claim 24, wherein the fuse includes a transistor provided with:
- a gate coupled to the common access node;
- a first junction end coupled to the first access node; and
- a second junction end coupled to the second access node.

26. The electronic device according to claim 24, wherein the first repair coupling block further includes:
- a third switch coupled to and disposed between the first spare line and a ground voltage end, and switching based on whether a first program operation is performed on the fuse or not; and
- a fourth switch coupled to and disposed between the second spare line and the ground voltage end, and switching based on whether a second program operation is performed on the fuse or not.

27. The electronic device according to claim 26, wherein when the first program operation is performed, the third switch couples the first spare line to the ground voltage end, the first switch couples the first spare line with the first access node, and the first driving block and the second driving block drive at least one among the first to fourth access lines with a third voltage.

28. The electronic device according to claim 27, wherein when the second program operation is performed, the fourth switch couples the second spare line to the ground voltage end, the second switch couples the second spare line to the second access node, and the first driving block and the second driving block drive at least one among the first to fourth access lines with the third voltage.

* * * * *